(12) United States Patent
Takenaga et al.

(10) Patent No.: US 8,427,866 B2
(45) Date of Patent: Apr. 23, 2013

(54) MAGNETIC STORAGE ELEMENT AND MAGNETIC STORAGE DEVICE

(75) Inventors: Takashi Takenaga, Tokyo (JP); Takeharu Kuroiwa, Tokyo (JP); Taisuke Furukawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/397,615

(22) Filed: Feb. 15, 2012

(65) Prior Publication Data

US 2012/0251847 A1 Oct. 4, 2012

(30) Foreign Application Priority Data

Mar. 29, 2011 (JP) ................................. 2011-072665

(51) Int. Cl.
*G11C 11/14* (2006.01)
(52) U.S. Cl.
USPC ........... 365/171; 365/148; 365/158; 365/172; 977/933; 977/935
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS 6,005,800 A * 12/1999 Koch et al. ..................... 365/173
6,104,633 A 8/2000 Abraham et al.
6,165,803 A * 12/2000 Chen et al. ......................... 438/3
6,368,878 B1 * 4/2002 Abraham et al. .................. 438/3

(Continued)

FOREIGN PATENT DOCUMENTS

| JP | 11-273337 | 10/1999 |
| JP | 2000-353791 | 12/2000 |

(Continued)

OTHER PUBLICATIONS

Mosca et al., "Oscillatory interlayer coupling and giant magnetoresistance in Co/Cu multilayers", Journal of Magnetism and Magnetic Materials, 1991, pp. L1-L5, 94, Elsevier Science Publishers B.V.

(Continued)

*Primary Examiner* — Harry W Byrne
(74) *Attorney, Agent, or Firm* — McDermott Will & Emery LLP

(57) ABSTRACT

There are provided magnetic storage elements capable of performing a high-reliability write operation by inhibiting erroneous reversal of data of the magnetic storage element put in a semi-selected state, and a magnetic storage device using this. A recording layer having an easy axis and a hard axis overlaps at least one of a first or second conductive layer at the entire region thereof in plan view. First endpoints of a first line segment along the easy axis and maximum in dimension overlapping the recording layer in plan view don't overlap the second conductive layer in plan view. At least one of second endpoints of a pair of endpoints of a second line segment passing through the middle point of the first line segment, orthogonal to the first line segment in plan view, and overlapping the recording layer in plan view doesn't overlap the first conductive layer in plan view.

7 Claims, 23 Drawing Sheets

U.S. PATENT DOCUMENTS

| | | | | |
|---|---|---|---|---|
| 6,570,783 | B1 * | 5/2003 | Deak | 365/158 |
| 6,605,836 | B2 * | 8/2003 | Kishi et al. | 257/295 |
| 2003/0189842 | A1 * | 10/2003 | Deak | 365/173 |
| 2003/0235068 | A1 * | 12/2003 | Deak | 365/158 |
| 2007/0014146 | A1 * | 1/2007 | Guo et al. | 365/158 |
| 2009/0250776 | A1 * | 10/2009 | Takenaga et al. | 257/421 |

FOREIGN PATENT DOCUMENTS

| | | |
|---|---|---|
| JP | 2002-280637 | 9/2002 |
| JP | 2004-296858 | 10/2004 |
| JP | 2005-310971 | 11/2005 |

OTHER PUBLICATIONS

Parkin, et al., "Oscillatory Magnetic Exchange Coupling through Thin Copper Layers", Physical Review Letters, Apr. 22, 1991, pp. 2152-2155, vol. 66 No. 16, The American Physical Society, USA.

Pratt, Jr., et al., "Perpendicular Giant Magnetoresistances of Ag/Co Multilayers", Physical Review Letters, Jun. 10, 1991, pp. 3060-3063, vol. 66 No. 23, The American Physical Society, USA.

Miyazaki, et al., "Giant magnetic tunneling effect in Fe/$Al_2O_3$Fe junction", Journal of Magnetism and Magnetic Materials, 1995, pp. L231-234, 139, Elsevier Science B.V.

Tehrani, et al., "High density submicron magnetoresistive random access memory (invited)", Journal of Applied Physics, Apr. 15, 1999, pp. 5822-5827, vol. 85 No. 8, American Institute of Physics, USA.

Parkin, et al., "Exchange-biased magnetic tunnel junctions and application to nonvolatile magnetic random access memory (invited)", Journal of Applied Physics, Apr. 15, 1999, pp. 5828-5833, vol. 85 No. 8, American Institute of Physics, USA.

Naji, et al., "A 256kb 3.0V 1T1MTJ Nonvolatile Magnetoresistive RAM", IEEE International Solid-State Circuits Conference, Feb. 6, 2001, pp. 1-3, 7.6 Session 7, IEEE.

* cited by examiner

MEMORY CELL REGION (MR)

MAGNETIC STORAGE ELEMENT AND MAGNETIC STORAGE DEVICE

CROSS-REFERENCE TO RELATED APPLICATIONS

The disclosure of Japanese Patent Application No. 2011-72665 filed on Mar. 29, 2011 including the specification, drawings and abstract is incorporated herein by reference in its entirety.

BACKGROUND

The present invention relates to a magnetic storage element and a magnetic storage device. More particularly, it relates to a magnetic storage element having a tunneling magnetoresistive effect, and a magnetic storage device using the same.

The magnetoresistive (MR) effect is a phenomenon that a magnetic substance is changed in electrical resistance by being applied with a magnetic field, and is used for a magnetic field sensor, a magnetic head, and the like. In recent years, as giant magnetoresistance: GMR effect materials exhibiting a very large magnetoresistive effect, artificial lattice films of Fe/Cr, Co/Cu, and the like have been introduced in the following Non-Patent Documents 1 and 2.

Whereas, there is proposed a magnetoresistive effect element using a multilayer structure having a non-magnetic metal layer with such a thickness as to eliminate the exchange coupling effect between ferromagnetic layers, and formed of ferromagnetic layer/non-magnetic layer/ferromagnetic layer/anti-ferromagnetic layer. In this element, the ferromagnetic layer and the anti-ferromagnetic layer are exchange coupled. Accordingly, the magnetic moment of the ferromagnetic layer is fixed, and only the spin of the other ferromagnetic layer can be reversed by an external magnetic field with ease. This is an element known as a so-called spin-valve structure. In this element, the exchange coupling between the two ferromagnetic layers is weak, and hence the spin can be reversed by a small magnetic field. For this reason, the spin valve structure can provide a magnetic storage element having a higher sensitivity with respect to the magnetic field as compared with the exchange coupled film. As the anti-ferromagnetic substance, there is used FeMn, IrMn, PtMn, or the like. The spin valve structure passes a current in the film in-plane direction when used. However, due to the foregoing feature, it is used for a high-density magnetic recording reproduction head.

On the other hand, use of the perpendicular magnetoresistive effect of passing a current in the direction perpendicular to the film plane provides a further larger magnetoresistive effect. This is disclosed in, for example, the following Non-Patent Document 3.

Further, the TMR: tunneling magnetoresistive effect due to the ferromagnetic tunneling junction is also disclosed in, for example, the following Non-Patent Document 4. The tunneling magnetoresistance is obtained by using the following fact: in a three-layer film formed of ferromagnetic layer/insulation layer/ferromagnetic layer, the directions of spins of the two ferromagnetic layers are changed into the same direction as each other or the opposite directions to each other; thus, the magnitude of the tunneling current in the direction perpendicular to the film plane varies depending on the directions of the spins.

In recent years, studies for using GMR and TMR elements for a nonvolatile magnetic storage semiconductor device (MRAM: magnetic random access memory) have been disclosed in, for example, the following Non-Patent Documents 5 to 7.

In this case, there is studied a pseudo-spin valve element or a ferromagnetic tunneling effect element in which a non-magnetic metal layer is sandwiched between two ferromagnetic layers having different coercive forces. When used for a MRAM, the elements are arranged in a matrix. A current is passed through a separately disposed wire to apply a magnetic field thereto. Thus, the two magnetic layers forming each element are controlled. Herein, by controlling the two magnetic layers in the same direction, "1" is recorded. Whereas, controlling the two magnetic layers in opposite directions to each other, "0" is recorded. Reading is performed using the GMR effect or the TMR effect.

For a MRAM, use of the TMR effect results in a lower power consumption than the use of the GMR effect. For this reason, use of TMR elements has been mainly studied. The MRAM using the TMR elements has the following features: a larger output voltage can be obtained because the resistance change ratio at room temperature is as large as 20% or more and the resistance at the tunneling junction is large; and a current for reading is much smaller because spin reversal is not required to be performed for reading; and other features. For these reasons, the MRAM using the TMR elements is expected as a low power consumption type nonvolatile semiconductor storage device capable of high-speed writing/reading.

In the write operation of the MRAM, it is desired to control the magnetic characteristics of the ferromagnetic layers in the TMR element. Specifically, there are demands for a technology of controlling the relative magnetization directions of the two ferromagnetic layers interposing a non-magnetic layer to the same direction, or the opposite directions, and a technology of causing magnetization reversal in one magnetic layer in a desirable magnetic storage element with reliability and efficiency. The technologies of uniformly controlling the relative magnetization directions of the two ferromagnetic layers interposing a non-magnetic layer to the same direction or opposite directions in the film plane by using two crossing wires are shown in, for example, the following Patent Documents 1, 3, 4, and 7.

Further, in a MRAM, when miniaturization of magnetic storage elements is performed for high integration, the reversed magnetic field increases due to the demagnetization field depending upon the size in the film plane direction of the magnetic layer. As a result, a large magnetic field becomes necessary for writing, and the power consumption also increases. For this reason, as indicated in, for example, the following Patent Documents 2, 5, 6, and 7, there are proposed the technologies of optimizing the shape of the ferromagnetic layer, and facilitating the magnetization reversal.

When miniaturization of magnetic storage elements is performed with an increase in integration density in a MRAM, a further larger magnetic field becomes necessary for writing due to the effect of the demagnetization field. This results in a larger effect of the magnetic field exerted on the periphery of the selected magnetic storage element. Accordingly, erroneous magnetization reversal becomes remarkable. In order to cope with this, a wire covered with a material having a high magnetic permeability such as Permalloy is formed, so that a magnetic field is concentrated to a TMR element. This is proposed in, for example, the following Patent Document 3.

PATENT DOCUMENTS

[Patent Document 1] Japanese Unexamined Patent Publication No. Hei 11 (1999)-273337
[Patent Document 2] Japanese Unexamined Patent Publication No. 2002-280637
[Patent Document 3] Japanese Unexamined Patent Publication No. 2000-353791
[Patent Document 4] U.S. Pat. No. 6,005,800
[Patent Document 5] Japanese Unexamined Patent Publication No. 2004-296858
[Patent Document 6] U.S. Pat. No. 6,570,783
[Patent Document 7] Japanese Unexamined Patent Publication No. 2005-310971

NON-PATENT DOCUMENTS

[Non-Patent Document 1] D. H. Mosca et al., "Oscillatory interlayer coupling and giant magnetoresistance in Co/Cu multilayers", Journal of Magnetism and Magnetic Materials 94 (1991) pp. L1-L5
[Non-Patent Document 2] S. S. P. Parkin et al., "Oscillatory Magnetic Exchange Coupling through Thin Copper Layers", Physical Review Letters, vol. 66, No. 16, 22 Apr. 1991, pp. 2152-2155
[Non-Patent Document 3] W. P. Pratt et al., "Perpendicular Giant Magnetoresistances of Ag/Co Multilayers", Physical Review Letters, vol. 66, No. 23, 10 Jun. 1991, pp. 3060-3063
[Non-Patent Document 4] T. Miyazaki et al., "Giant magnetic tunneling effect in Fe/$Al_2O_3$/Fe junction", Journal of Magnetism and Magnetic Materials 139 (1995), pp. L231-L241
[Non-Patent Document 4] S. Tehrani et al., "High density submicron magnetoresistive random access memory (invited)", Journal of Applied Physics, vol. 85, No. 8, 15 Apr. 1999, pp. 5822-5827
[Non-Patent Document 6] S. S. P. Parkin et al., "Exchange-biased magnetic tunnel junctions and application to nonvolatile magnetic random access memory (invited)", Journal of Applied Physics, vol. 85, No. 8, 15 Apr. 1999, pp. 5828-5833
[Non-Patent Document 7] ISSCC 2001 Dig of Tech. Papers, p. 122

SUMMARY

In a MRAM, at the time of the write operation, other magnetic storage elements disposed at positions overlapping the same bit line or write line as that for a magnetic storage element to be subjected to writing in plan view are put in a semi-selected state. In this semi-selected state, the other magnetic storage elements disposed at positions overlapping the same write line as that for the magnetic storage element to be subjected to writing in plan view are also applied with a magnetic field by a bit line or write line current.

In a MRAM, the photomechanical process and etching in the manufacturing steps of the magnetic storage elements cause variations in shape of the recording layer of each magnetic storage element in respective memory cells in a plurality of MRAM memory cells disposed in a matrix. Accordingly, the magnetic field for reversing the magnetization in the recording layer may be reduced according to the shape of the recording layer of the magnetic storage element. Further, the recording layer of the magnetic storage element increases in probability of being reversed in magnetization by a heat energy with miniaturization. Accordingly, in the recording layer requiring a small magnetic field in order to undergo magnetization reversal, when the recording layer is put in a semi-selected state by a bit line or write line current, the magnetic field of the bit line or write line current may unintentionally reverse the magnetization in the recording layer. In the magnetic field due to the bit line current, when the magnetization in the recording layer is opposite to the magnetic field direction, it is reversed to the magnetic field direction. In the magnetic field due to the write line current, when the write line current becomes 0 after saturation of the magnetization in the recording layer in the direction of the hard axis, the magnetization in the recording layer is oriented in either of both directions along the direction of the easy axis. However, their respective probabilities are ideally ½. For these reasons, the magnetization in the recording layer becomes unable to be controlled, which makes impossible holding of information. This unfavorably results in the occurrence of erroneous reversal of data of the magnetic storage element.

The present invention was completed in view of the foregoing problems. It is an object of the present invention to provide magnetic storage elements capable of performing a high-reliability write operation by inhibiting the erroneous reversal of data of the magnetic storage element put in a semi-selected state, and a magnetic storage device using the same.

A magnetic storage element in accordance with the present invention includes: a recording layer changeable in magnetization direction by an external magnetic field, and having an easy axis along a direction in which magnetization is easy, and a hard axis along a direction which crosses the easy axis and in which magnetization is hard; a first conductive layer for forming a magnetic field along a direction of extension of the hard axis in plan view; and a second conductive layer for forming a magnetic field along a direction of extension of the easy axis in plan view. The recording layer is disposed in such a manner as to overlap at least one of the first or second conductive layer at the entire region thereof in plan view. First endpoints which are a pair of endpoints of a first line segment along the easy axis, and maximum in dimension overlapping the recording layer in plan view do not overlap the second conductive layer in plan view. At least one of second endpoints which are a pair of endpoints of a second line segment passing through the middle point of the first line segment, orthogonal to the first line segment in plan view, and overlapping the recording layer in plan view does not overlap the first conductive layer in plan view.

With the magnetic storage element in accordance with the present invention, the recording layer is disposed in such a manner as to overlap at least one of the first or second conductive layer at the entire region thereof in plan view. Accordingly, it is possible to increase the magnetic field applied to the recording layer due to the current of the first or second conductive layer when the magnetic storage element is in a selected state. This can inhibit the increase in current necessary for the write operation. Further, a pair of the first endpoints overlap the first conductive layer, but do not overlap the second conductive layer in plan view. At least one of a pair of the second endpoints overlaps the second conductive layer, but does not overlap the first conductive layer. For this reason, it is possible to inhibit the saturation of magnetization in the recording layer, and the erroneous reversal of magnetization due to the saturation of magnetization when the magnetic storage element is in a semi-selected state.

BRIEF DESCRITPION OF THE DRAWINGS

Figure 33:
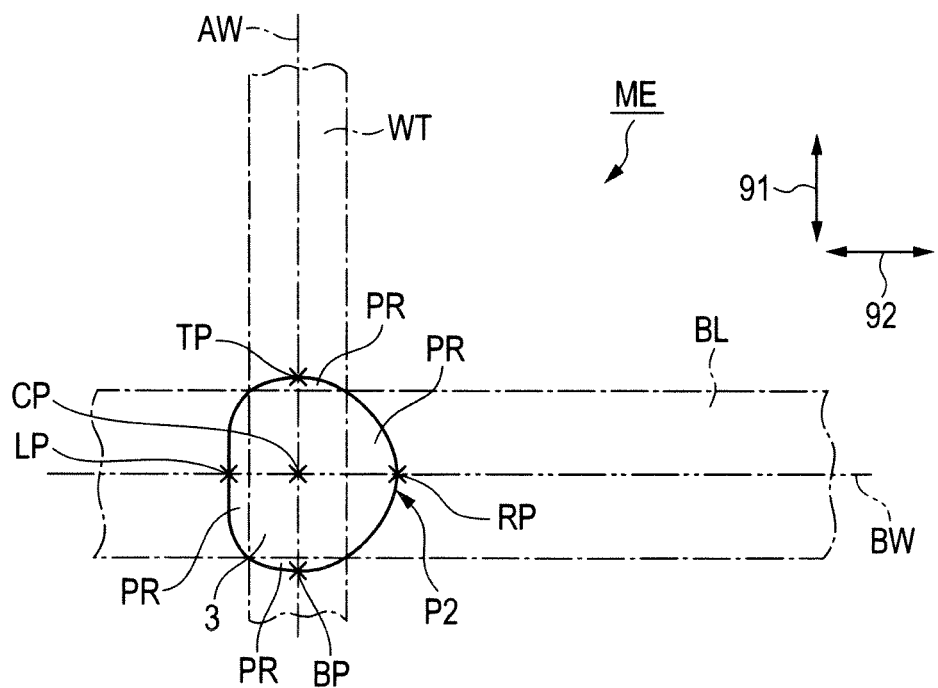
Figure 34:
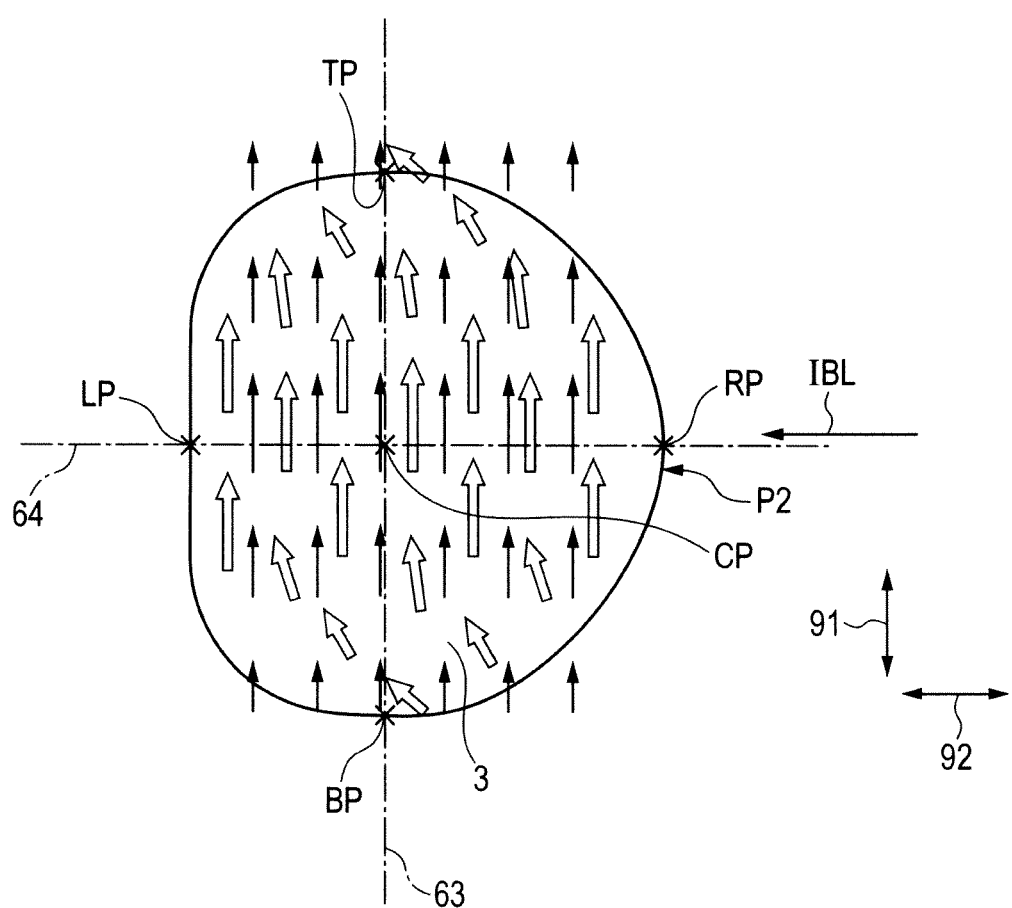

FIG. 33 is a schematic plan view showing the positional relationship between a recording layer and wiring of a magnetic storage element in a fifth example of the second embodiment of the present invention; and FIG. 34 is a schematic plan view showing the distribution of magnetization when the recording layer shown in FIG. 33 is put in a semi-selected state by the bit line current of the second embodiment of the present invention.

DETAILED DESCRIPTION

Below, embodiments of the present invention will be described by reference to the accompanying drawings.

First Embodiment

First, as the present embodiment, a semiconductor device in a chip state will be described by reference to FIG. 1.

Figure 1:
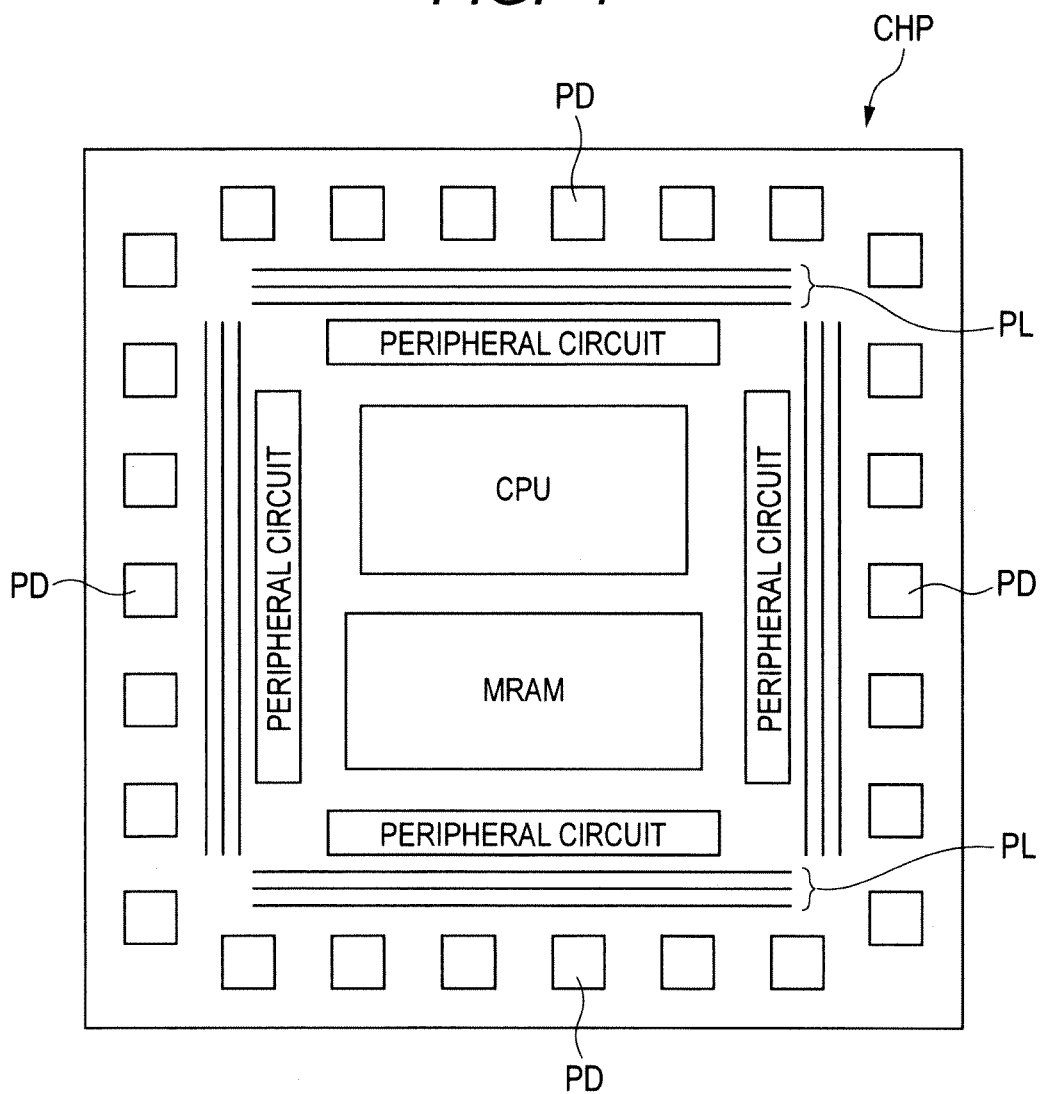
FIG. 1 is a plan view of the whole of a semiconductor device in accordance with a first embodiment of the present invention.

Referring to FIG. 1, a semiconductor chip CHP in the present embodiment has a CPU (Central Processing Unit), a MRAM, peripheral circuits, and power lines PL. In the peripheral part of the semiconductor chip CHP, pads PD are disposed.

The CPU is a circuit also referred to as a central arithmetic processing part, and reads and decodes instructions from a storage device, and performs various operations and controls based on them. For this reason, the CPU is required to perform high-speed processings.

A MRAM is an element (magnetic storage device) capable of reading and writing stored information at random using magnetism. The MRAM is a memory element not only functioning as a nonvolatile memory whose stored state is held even when a power source is cut off, but also having a high-speed random access function. However, the MRAM has, other than the memory elements, a circuit for writing information in the memory elements, or reading information from the memory elements, selection transistors for selecting an element from and on which information is read and written of a plurality of arrayed elements, and the like.

The peripheral circuits are circuits for forming the system of the semiconductor device with the CPU and the MRAM, and includes, for example, a power circuit, a clock circuit, and a reset circuit. The peripheral circuit includes a digital circuit for processing digital signals, and an analog circuit for processing analog signals. The analog circuit is a circuit dealing with temporally continuously changing voltage or current signals, i.e., analog signals, and includes, for example, an amplification circuit, a conversion circuit, a modulation circuit, an oscillation circuit, and a power circuit.

The power lines PL are lines for supplying a voltage for operating the CPU, the MRAM, and the peripheral circuits, and each include a power source line and a ground line. The CPU, the MRAM, and the peripheral circuits are coupled with the power lines, and can be operated by power source supply from the power lines.

The pads PAD are external coupling terminals for performing input/output with units (circuits) coupled to the outside of the semiconductor chip CHP. Input signals are inputted to the CPU and the like formed in the semiconductor chip CHP via the pads PD. Whereas, output signals from the CPU are outputted to the units (circuits) coupled to the outside of the semiconductor chip CHP via the pads PD.

Then, an equivalent circuit of the MRAM will be described by reference to FIGS. 2 and 3.

Figure 2:
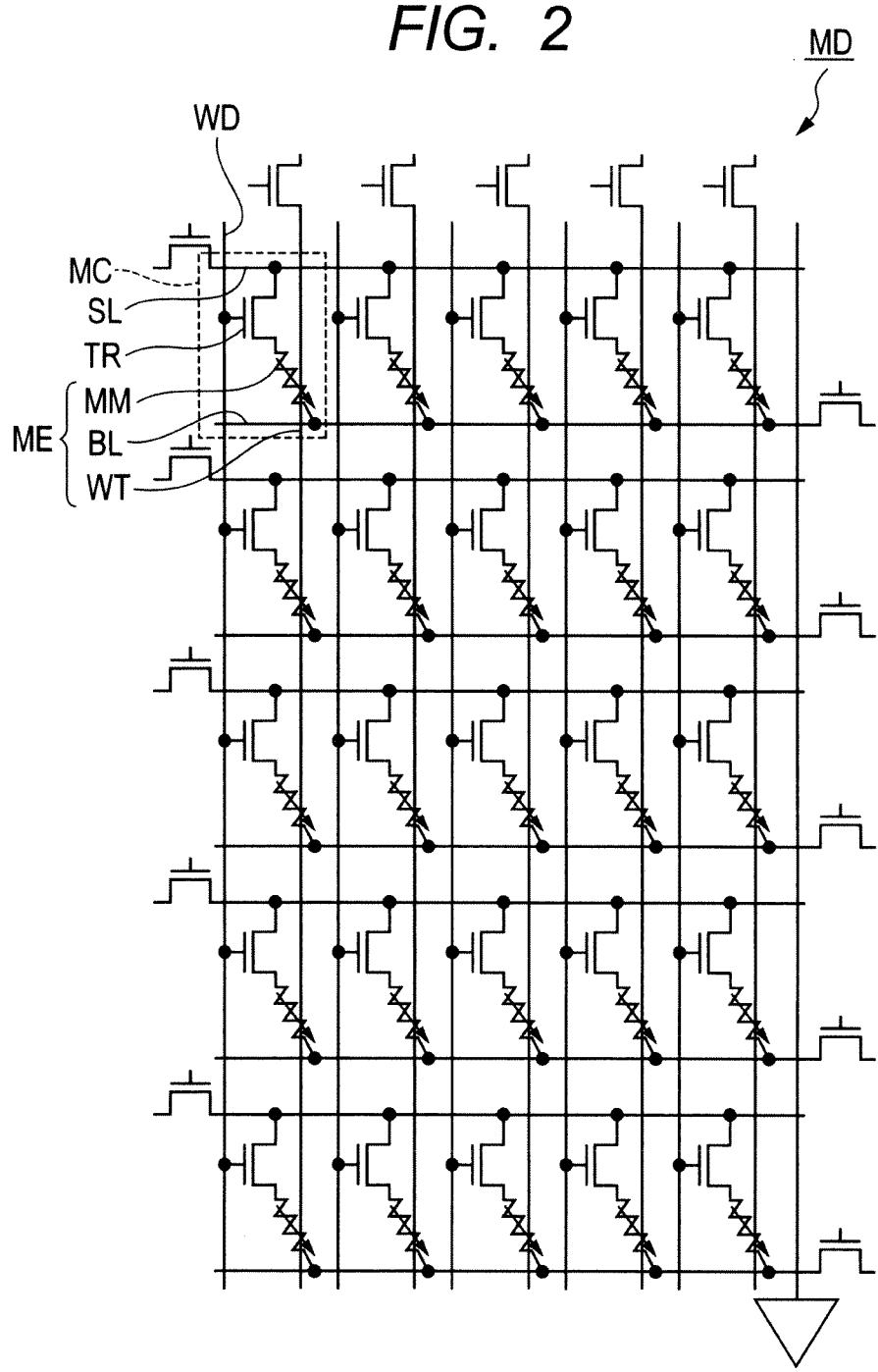
FIG. 2 is a circuit diagram of the whole of the semiconductor device in accordance with the first embodiment of the present invention.
Figure 3:
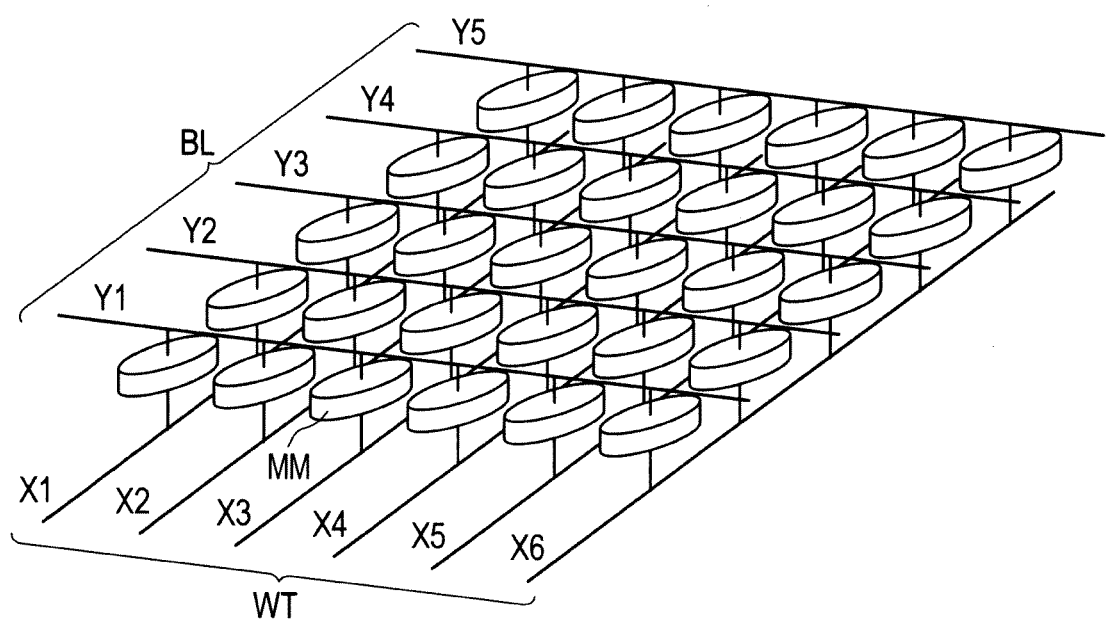
FIG. 3 is a schematic structure perspective view showing the positional relationship between magnetic storage elements and bit lines in a memory cell of a MRAM in accordance with the first embodiment of the present invention.

Referring to FIG. 2, in a circuit formed of a magnetic storage device MD as a MRAM, a plurality of MRAM memory cells MC (in a dotted frame) are disposed in a matrix. In other words, the MRAM forms a memory cell array including a plurality of memory cells MC disposed in an array. Each of the plurality of memory cells MC has an element selecting transistor TR and a ferromagnetic tunneling junction element MM. The ferromagnetic tunneling junction element MM includes a recording layer as described later.

A magnetic storage element ME of the present embodiment includes the ferromagnetic tunneling junction element MM, a write line WT (first conductive layer), and a bit line BL (second conductive layer). The write line WT and the bit line BL write or read information. The magnetic storage element ME is selected and controlled as an element from and in which information is to be read and written by the element selecting transistor TR.

The bit lines BL and the write lines WT are disposed in a plurality of numbers in an array as with the memory cell MC. The bit lines BL are electrically coupled with respective one ends (e.g., the top side of FIG. 3) of the ferromagnetic tunneling junction elements MM disposed side by side in a plurality of rows (e.g., five rows of Y1 to Y5 of FIG. 3) in one direction (e.g., the left-to-right direction of FIG. 2), respectively. The write lines WT are electrically coupled with respective other ends (e.g., the bottom side of FIG. 3) of the ferromagnetic tunneling junction elements MM disposed side by side in a plurality of rows (e.g., six rows of X1 to X6 of FIG. 3) in the direction crossing the bit lines BL (e.g., the top-to-bottom direction of FIG. 2), respectively.

Other than the write lines WT, the drains of the element selecting transistors TR are electrically coupled to the sides of the respective other ends of the ferromagnetic tunneling junction elements MM. Other than this, source lines SL are electrically coupled with respective sources of the plurality of element selecting transistors TR. The word lines WD are electrically coupled with the respective gates of the element selecting transistors TR.

The MRAM has, other than the foregoing ones, although not shown, a word line driver band electrically coupled with each of the plurality of word lines WD, a data read circuit electrically coupled with each of the plurality of source lines SL, a data write circuit electrically coupled with the bit lines BL via the element selecting transistors TR, and a column decoder electrically coupled with respective gates of the element selecting transistors TR.

Thus, the MRAM has a circuit configuration in which a plurality of lines extending in the transverse direction and the longitudinal direction are present, and the memory cells MC are disposed in an array. Such a MRAM randomly accesses specific memory cells MC in response to external control signals and address signals. Then, the MRAM writes input data $D_{in}$ or reads output data $D_{out}$ with respect to the accessed specific memory cells.

Then, the configuration of the MRAM of the present embodiment will be described by reference to FIGS. 4 to 11.

Figure 4:
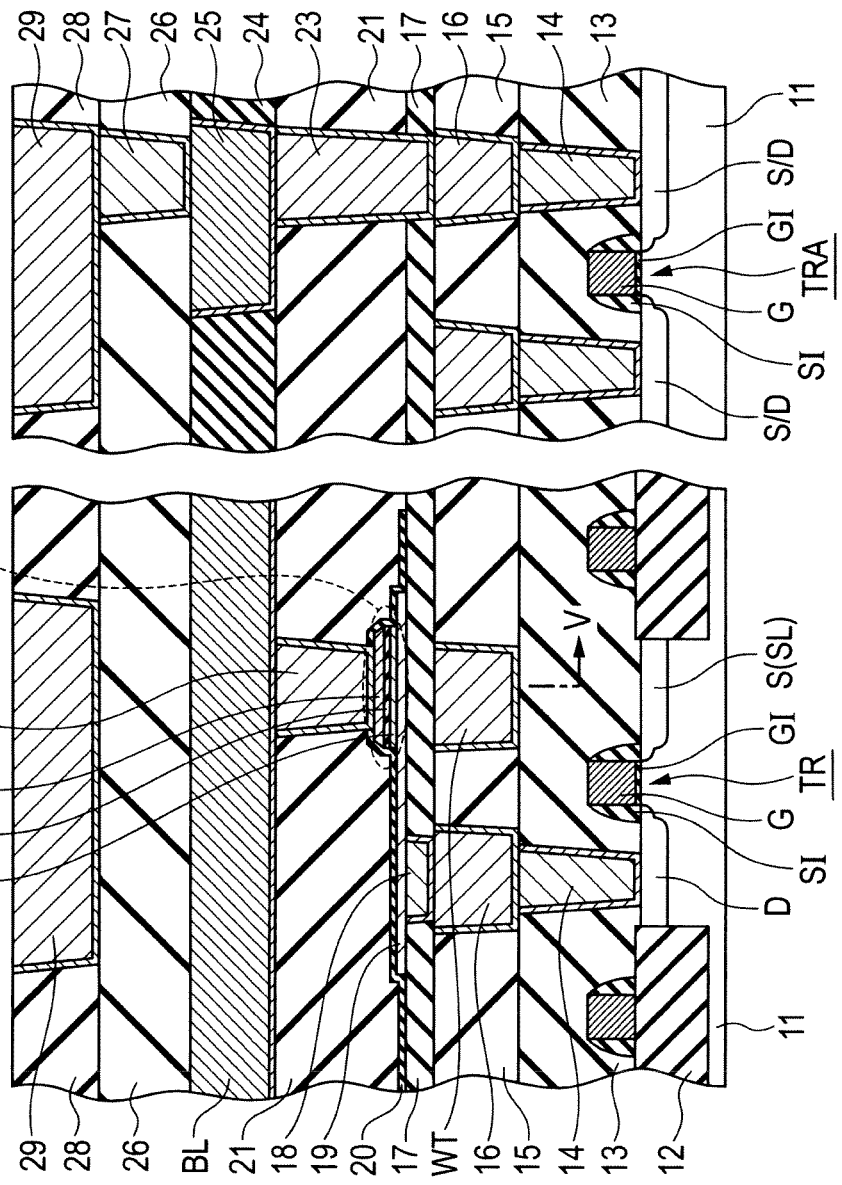
FIG. 4 is a schematic cross-sectional view showing a configuration of a magnetic storage device in accordance with the first embodiment of the present invention.
Figure 5:
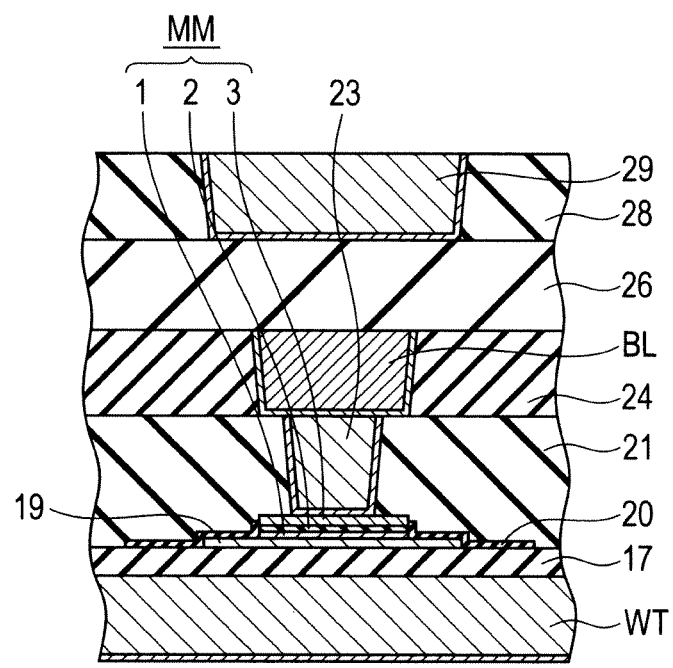
FIG. 5 is a schematic cross-sectional view at a portion along line V-V of FIG. 4.

Referring to FIGS. 4 and 5, the MRAM has a memory cell region MR and a logic (peripheral) circuit region RR. The memory cell of the MRAM formed in the memory cell region MR has a selecting transistor TR and a ferromagnetic tunneling junction element MM. The memory cells are electrically isolated from each other by an element isolation insulation film 12 in the inside of a semiconductor substrate 11.

The element selecting transistor TR has a pair of source region S/drain region D which are impurity diffusion layers containing, for example, boron, phosphorus, and arsenic, a gate insulation film GI formed of a silicon oxide film, and a gate electrode main body G formed of a conductor such as polysilicon or a metal film. A pair of the source region S/drain region D are spaced from each other in the main surface of the semiconductor substrate 11. The source region S and the drain region D are both formed of an n type or p type impurity region. The gate electrode mainbody G is formed over the surface of the semiconductor substrate 11 interposed between the pair of source region S/drain region D via the gate insulation film GI. Incidentally, the surfaces of the pair of source region S/drain region D, and the gate electrode main body G may be silicided. The sidewall of the gate electrode main body G is covered with a sidewall-like sidewall insulation film SI. The sidewall insulation film SI is formed of a silicon oxide film or a silicon nitride film.

An interlayer insulation film 13 formed of, for example, a silicon oxide film is formed in such a manner as to cover the element selecting transistor TR. In the interlayer insulation film 13, there is provided a hole reaching the drain region D from the top surface thereof. In the hole, a coupling member 14 is formed. Over the interlayer insulation film 13, an interlayer insulation film 15 is formed. In the interlayer insulation film 15, there are formed a hole reaching the coupling member 14 and a hole reaching the interlayer insulation film 13 from the top surface thereof. In the holes, there are formed a write line WT and a wiring layer 16, respectively. The wiring layer 16 is electrically coupled with the drain region D through the coupling member 14. Incidentally, the side surfaces and the bottom surfaces of the coupling member (wiring layer) 14 (16), and the write line WT are preferably covered with, for example, a barrier metal (the diagonally shaded areas of FIGS. 4 and 5). The barrier metal is a thin film for inhibiting the reaction between the metal material forming the coupling member and the interlayer insulation film. The barrier metal is preferably comprised of, for example, a thin film of tantalum, or a thin film of titanium nitride.

An interlayer insulation film 17 is formed over the interlayer insulation film 13 in such a manner as to cover the write line WT and the wiring layer 16. In the interlayer insulation film 17, there is formed a hole reaching the wiring layer 16 from the top surface thereof. In the hole, a coupling member 18 is formed. The side surface and the bottom surface of the coupling member 18 are preferably covered with, for example, a barrier metal. Over the interlayer insulation film 17, there are formed a conductive layer 19 and a ferromagnetic tunneling junction element MM. The conductive layer 19 is electrically coupled with the drain region D through the coupling members 18, 16, and 14.

The ferromagnetic tunneling junction element MM is a magnetoresistive effect element, and has a fixed layer 1, a tunneling insulation layer 2 which is a non-magnetic layer, and a recording layer 3. The fixed layer 1 is formed in such a manner as to be in contact with the conductive layer 19.

A protective film 20 formed of, for example, a silicon nitride film is formed in such a manner as to cover the ferromagnetic tunneling junction element MM. Over the protective film 20, an interlayer insulation film 21 is formed. In the protective film 20 and the interlayer insulation film 21, there is provided a hole penetrating through the films 20 and 21, and reaching the recording layer 3. In the hole, a coupling member 23 is formed. Over the interlayer insulation film 21, there are formed an interlayer insulation film 24 and a bit line BL. The bit line BL is electrically coupled with the ferromagnetic tunneling junction element MM through the coupling member 23.

An interlayer insulation film 26 is formed in such a manner as to cover the bit line BL. Over the interlayer insulation film 21, there are formed a prescribed wiring layer 29 and an interlayer insulation film 28.

By the foregoing mode, the bit line BL, the coupling member 23, the ferromagnetic tunneling junction element MM, the conductive layer 19, the coupling member 18, the wiring layer 16, the coupling member 14, and the drain region D are respectively electrically coupled.

On the other hand, in the peripheral part in plan view of the memory cell region MR in the semiconductor substrate 11, peripheral (logic) circuit regions RR is formed. In each logic circuit region RR, transistors TRA forming a logic circuit are formed. It is preferable that each transistor TRA has basically the same configuration as that of the element selecting transistor TR. The operation of the magnetic storage element ME in the memory cell region MR and the like are controlled. Further, the logic circuit region RR includes the peripheral circuit region in the memory cell region MR. In the peripheral circuit regions, there are formed semiconductor elements such as the transistor TRA for controlling the operation of the memory cell (magnetic storage element), and the like, and the wiring layers and the coupling members for electrically coupling the semiconductor elements to each other. The wiring layers and the coupling members mean the coupling members 14, 23, and 27, and the wiring layers 16, 25, and 29.

In the foregoing description, the wiring layer is a conductive layer disposed as the same layer as the conductive layers such as the bit line BL and the write line WT, and a region for electrically coupling the conductive regions disposed at a different layer from the coupling members. Incidentally, in FIGS. 4 and 5, the source line SL and the word line WD are not shown.

Figure 6:
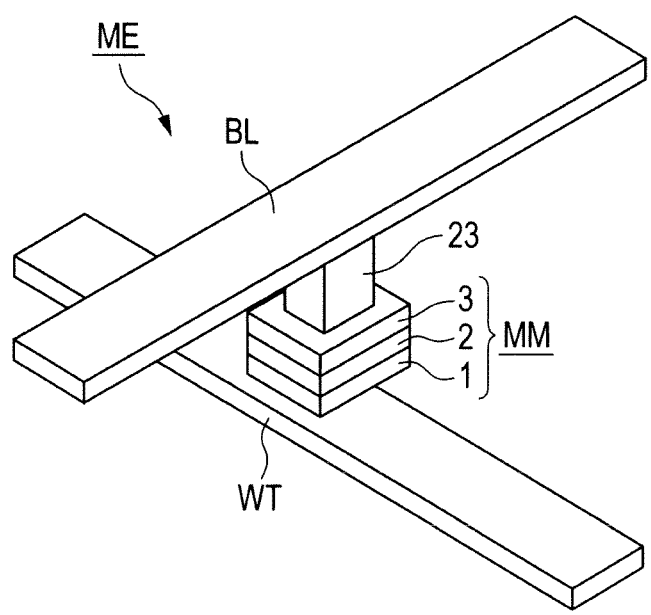
FIG. 6 is a perspective view schematically showing a configuration of the magnetic storage element in the first embodiment of the present invention.

Referring to FIG. 6, the magnetic storage element ME is formed of the ferromagnetic tunneling junction element MM, the write line WT (first conductive layer), and the bit line BL (second conductive layer) as described above. On the top side of the ferromagnetic tunneling junction element MM, and on the bottom side of the ferromagnetic tunneling junction element MM, the bit line BL and the write line WT are disposed, respectively, in such a manner as to cross each other in plan view. Both extend in such a manner as to be along the main surface of the semiconductor substrate 11. In other words, the ferromagnetic tunneling junction element MM is disposed in such a manner as to be interposed between the write line WT and the bit line BL.

Figure 7:
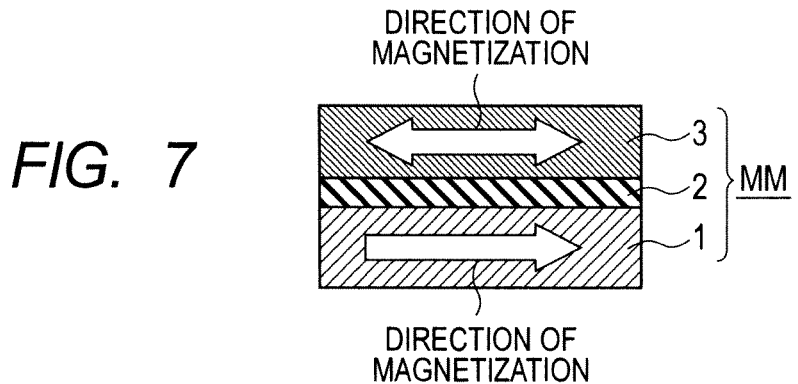
FIG. 7 is a cross-sectional view schematically showing a first example of a configuration of a ferromagnetic tunneling junction element in the first embodiment of the present invention.
Figure 8:
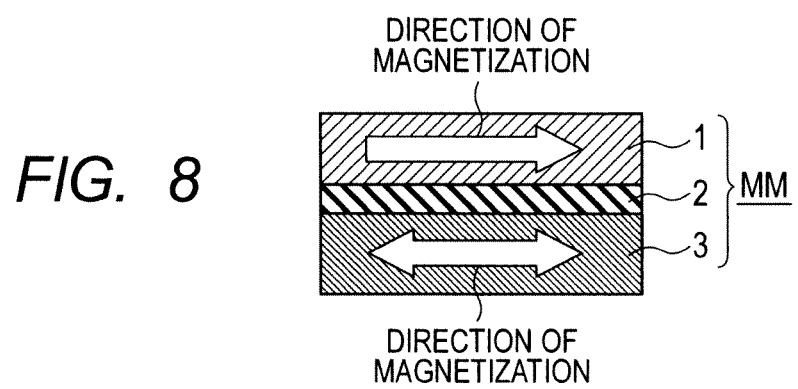
FIG. 8 is a cross-sectional view schematically showing a second example of a configuration of a ferromagnetic tunneling junction element in the first embodiment of the present invention.

Referring to FIG. 7, the ferromagnetic tunneling junction element MM is in a multilayer structure of, for example, the fixed layer 1, the tunneling insulation layer 2, and the recording layer 3. As shown in FIG. 7, in the fixed layer 1, for example, as indicated with the rightward arrow of FIG. 7, the direction of magnetization is fixed in one direction. In the recording layer 3, the direction of magnetization can be changed by an external magnetic field. For example, as indicated with both the leftward and rightward arrows of FIG. 7, the direction of magnetization can be changed into two directions opposite to each other. The direction of magnetization in the recording layer 3 is changed by the magnetic field generated by the current flowing through a prescribed wire (e.g., the bit line BL or the write line WT). Alternatively, the direction of magnetization in the recording layer 3 can also be changed by injection of spin-polarized electrons into the inside of the recording layer 3.

The ferromagnetic tunneling junction element MM of FIG. 7 includes the fixed layer 1, the tunneling insulation layer 2, and the recording layer 3 stacked in this order. In contrast, as with the ferromagnetic tunneling junction element MM of FIG. 8, the recording layer 3, the tunneling insulation layer 2, and the fixed layer 1 may be stacked in this order.

The fixed layer 1 is electrically coupled with the drain region D of the element selecting transistor TR through the conductive layer 19, and the coupling members 18, 16, and 14. On the other hand, the recording layer 3 is electrically coupled with the bit line BL through the coupling member 23.

Figure 9:
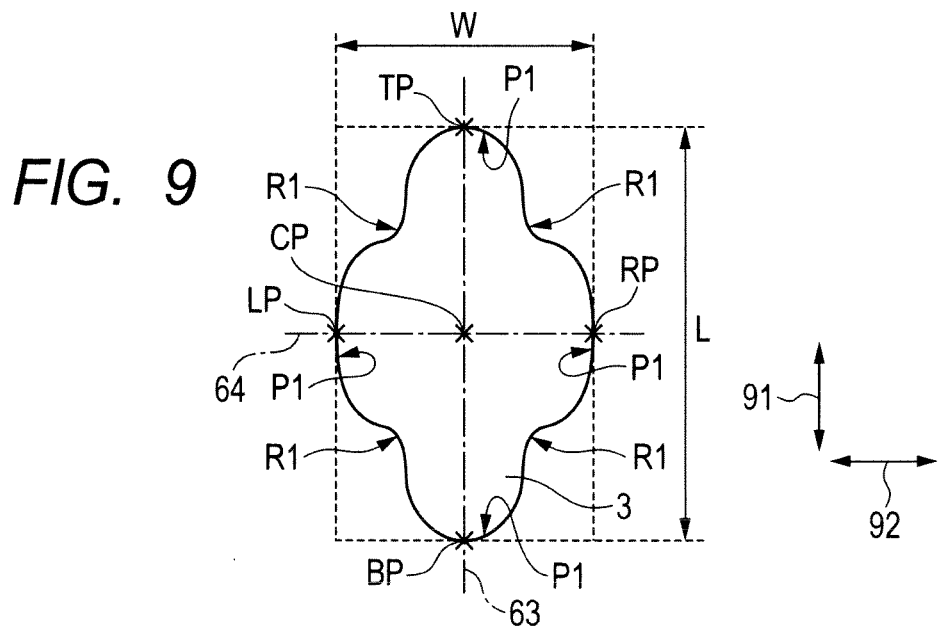
FIG. 9 is a schematic plan view showing the planar shape of a recording layer in the first example of the first embodiment of the present invention.

Referring to FIG. 9, the recording layer 3 preferably has a shape in which one direction (e.g., the top-to-bottom direction of FIG. 9) is longer than the direction (e.g., the left-to-right direction of FIG. 9) crossing with the one direction. The recording layer 3 has an outer edge in a smoothly curving shape in plan view.

In the directions of magnetization in the recording layer 3 changed by an externally applied magnetic field, generally, there is a direction in which magnetization is easy to achieve according to the crystal structure, the shape, and the like. The straight line (axis) along the direction in which magnetization is easy to achieve is referred to as the easy axis (Ea: Easy-axis). The easy axis extends in the direction indicated by an arrow 91 in FIG. 9. When the recording layer 3 is magnetized in the direction along the easy axis 91, the crystal forming the recording layer 3 is rendered in a low energy state. In contrast, the direction in which the recording layer 3 is difficult to magnetize is referred to as the hard axis (Ha: Hard-axis). The hard axis extends in the direction indicated with an arrow 92 in FIG. 9. The hard axis extends in the direction crossing the easy axis 91. In the present embodiment, the hard axis 92 is roughly orthogonal to the easy axis 91. However, the directions of the hard axis 92 and the easy axis 91 of the recording layer 3 depend on the material and the planar shape of the recording layer 3. For this reason, the hard axis 92 and the easy axis 91 of the recording layer 3 is not required to be orthogonal to each other.

Generally, the recording layer 3 is magnetized in the direction of extension of the easy axis 91. A change is effected between two possible magnetized states in the recording layer 3 according to whether the direction of the magnetic field is oriented toward one side (e.g., the left side of FIG. 7) on a straight line along which the easy axis 91 extends, or oriented toward the other side (e.g., the right side of FIG. 7) in a direction 180° opposite to the one side. The magnetized state of the recording layer 3 according to the direction of magnetization is recorded as data held by the recording layer 3 in a binary number form.

The outer edge in plan view of the recording layer 3 has four projecting parts P1 and four recessed parts R1. Herein, the projecting part P1 denotes a region curved from the inside outward, and having an inflection point (e.g., ceasing to curve from the outside inwardly, or to curve in any direction) as an end, of the outer edge of the recording layer 3. The recessed part R1 denotes a region curving from the outside inward, and having an inflection point (e.g., ceasing to curve from the inside outward, or to curve in any direction) as an end, of the outer edge of the recording layer 3. The four projecting parts P1 are formed so as to include the top periphery TP, the bottom periphery BP, the left periphery LP, and the right periphery RP, respectively.

Herein, there is virtually considered a first line segment which extends in the direction along the easy axis 91 and whose dimension (length) overlapping the recording layer 3 in plan view is a maximum of L. Herein, the first line segment is a line segment as the overlapping region of a virtual first straight line 63 extending in parallel with the easy axis 91 with the recording layer 3 in plan view. A pair of points of intersection (a pair of first endpoints of the first line segment) of the first line segment and the outer edge of the recording layer 3 are the top periphery TP and the bottom periphery BP, respectively. The line segment coupling the top periphery TP and the bottom periphery BP is the first line segment having a length L.

Further, there is virtually considered a second line segment passing through the central point CP (middle point) of the first line segment, orthogonal to the first line segment in plan view, and overlapping the recording layer 3 in plan view. Herein, the second line segment is a line segment as the overlapping region of a second straight line 64 orthogonal to the first straight line 63 with the recording layer 3 in plan view. A pair of points of intersection (a pair of second endpoints of the second line segment) of the second line segment and the outer edge of the recording layer 3 are the left periphery LP and the right periphery RP, respectively. The line segment coupling the left periphery LP and the right periphery RP is the second line segment having a length W. In the present embodiment, the easy axis 91 is roughly orthogonal to the hard axis 92. Accordingly, the second line segment extends in the direction along the hard axis 92.

The central point CP is a point of intersection between the first line segment and the second line segment, and is also a point of intersection between the first straight line 63 and the second straight line 64. The second line segment extends in such a manner as to pass through the central point CP of the first line segment, and to be orthogonal to the first line segment. Accordingly, the second line segment (second straight line) is disposed in such a manner as to divide the length L of the first line segment (the maximum length L of the first straight line) into two equal lengths.

The recording layer 3 of the first example of the present embodiment has a planar shape symmetrical with respect to the first straight line (first line segment) and the second straight line (second line segment). Therefore, the central point CP which is the point of intersection between the first line segment and the second line segment is each middle point of the first line segment and the second line segment.

Incidentally, the fixed layer 1 and the tunneling insulation layer 2 stacked in the recording layer 3 are preferably roughly equal in shape and size to the recording layer 3 in plan view, but may be different in shape and size from the recording layer 3.

Figure 10:
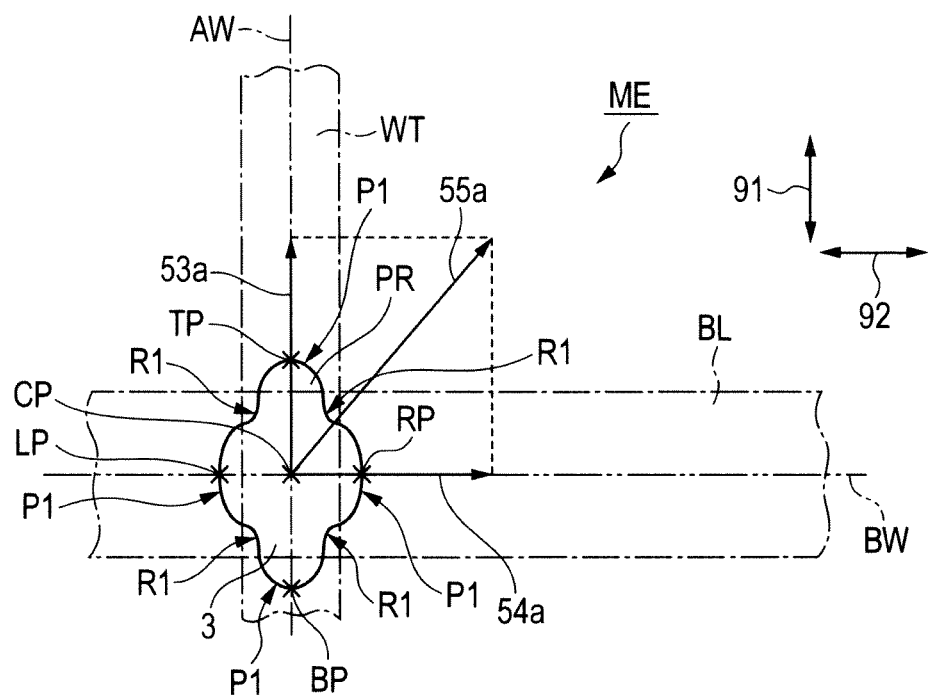
FIG. 10 is a schematic plan view showing the positional relationship between the recording layer and wiring of the magnetic storage element in the first example of the first embodiment of the present invention.
Figure 11:
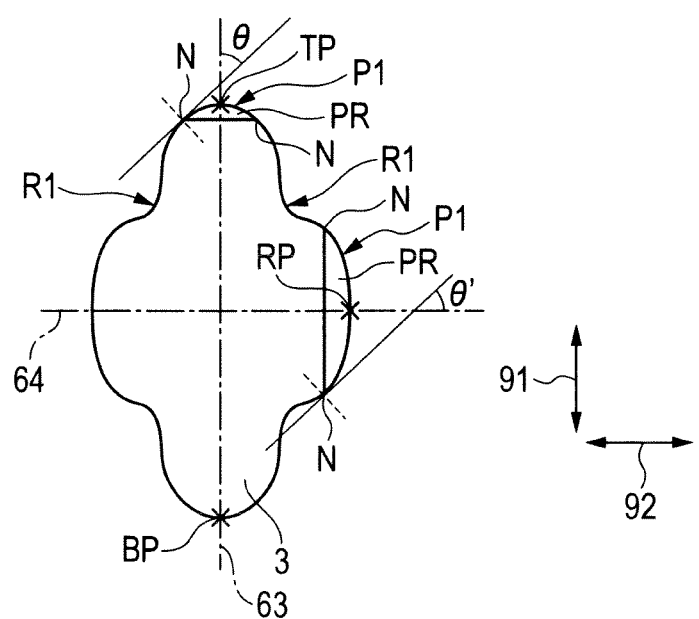
FIG. 11 is a schematic plan view for illustrating the periphery regions of the recording layer shown in FIG. 10.

Referring to FIG. 10, in the first example of the present embodiment, the write line WT extends in the direction along (roughly in parallel with) the direction of extension of the easy axis 91. Herein, considering a virtual write center line AW (center line of the first conductive layer) passing through the center in the width direction (the left-to-right direction of FIG. 10) of the write line WT, and extending along the write line WT, the write center line AW and the write line WT extend in the direction along (roughly in parallel with) the direction of extension of the easy axis 91. For this reason, the write line WT forms a magnetic field in the direction crossing (e.g., perpendicular to) the direction of extension of the easy axis 91 of the recording layer 3. More specifically, the write line WT forms a magnetic field along the direction of extension of the hard axis 92 of the recording layer 3 in plan view.

Further, in the present embodiment, the bit line BL extends in the direction crossing (roughly perpendicular to) the write line WT in plan view. Herein, considering a virtual bit center line BW passing through the center in the width direction (the top-to-down direction of FIG. 10) of the bit line BT, and extending in such a manner as to be along the bit line BT, the bit center line BW and the bit line BT extend along the direction of extension of the hard axis 92, and extend in the direction crossing (roughly perpendicular to) the direction of extension of the easy axis 91. For this reason, the bit line BL forms a magnetic field in the direction crossing (e.g., perpendicular to) the direction of extension of the hard axis 92 of the recording layer 3. More particularly, the bit line BL forms a magnetic field along the direction of extension of the easy axis 91 of the recording layer 3 in plan view. However, the direction of extension of the write center line AW and the bit center line BW may be a different direction from the foregoing in a region not overlapping the recording layer 3.

In the first example of the present embodiment, the write center line AW overlaps the first straight line 63 and the first line segment, and the bit center line BW roughly perpendicular thereto overlaps the second straight line 64 and the second line segment. In other words, the top periphery TP and the bottom periphery BP are disposed on the center line AW, and the left periphery LP and the right periphery RP (a pair of the second endpoints) are disposed on the bit center line BW (on the center line of the second conductive layer).

In summary, in the first example of the present embodiment, the easy axis 91, the write line WT, the write center line AW, and the first straight line 63 extend in the directions roughly in parallel with one another. The write center line AW, the first straight line 63, and the first line segment overlap one another in plan view. The hard axis 92, the bit line BL, the bit center line BW, and the second straight line 64 extend in the directions roughly in parallel with one another. The bit centerline BW, the second straight line 64, and the second line segment overlap one another in plan view. Further, the easy axis 91 and the hard axis 92 (the write line WT and the bit line BL, the first straight line 63 and the second straight line 64) extend in such a manner as to be roughly orthogonal to each other.

In the first example of the present embodiment, the recording layer 3 is disposed in such a manner as to overlap at least one of the write line WT and the bit line BL at the entire region thereof in plan view, and is disposed so that some region of the recording layer 3 overlaps both of the write line WT and the bit line BL. The top periphery TP and the bottom periphery BP of the recording layer 3 overlap the write line WT, but do not overlap the bit line BL in plan view. The left periphery LP and the right periphery RP of the recording layer 3 overlap the bit line BL, but does not overlap the write line WT in plan view.

Incidentally, not limited to the top periphery TP and the left periphery LP as the first and second endpoints, and the like, more preferably, the periphery region PR occupying a given area in plan view overlaps only any one of the write line WT and the bit line BL, and does not overlap both of the write line WT and the bit line BL in plan view. Specifically, referring to FIG. 11, first, points on the outer edge of the recording layer 3 will be considered. Out of the points such that the angle θ formed between the tangent at each of the points (along the easy axis 91) and the first straight line 63 is 45°, the point N closest to the top periphery TP or the bottom periphery BP will be identified. The points N are generally present in a pair interposing a pair of the first endpoints (the top periphery TP or the bottom periphery BP) because the recording layer 3 has a planar shape symmetrical with respect to the first (second) straight line 63 (64). The region surrounded by the line segment coupling the pair of points N, and the outer edge of the recording layer 3 closer to the top periphery TP or the bottom periphery BP than to the points N is the periphery region PR.

The left periphery LP and the right periphery RP will be also considered similarly. Namely, first, out of points such that the angle θ' formed between the tangent at each of the points and the second straight line 64 is 45° of the points on the outer edge of the recording layer 3, the point N closest to the left periphery LP or the right periphery RP will be identified. The points N are generally present in a pair interposing a pair of the second endpoints (the left periphery LP or the right periphery RP) similarly as described above. The region surrounded by the line segment coupling the pair of points N, and the outer edge of the recording layer 3 closer to the left periphery LP or the right periphery RP than to the points N is the periphery region PR.

Preferably, the periphery regions PR including the top periphery TP and the bottom periphery BP overlap the write line WT, and do not overlap the bit line BL in plan view. Preferably, the periphery regions PR including the left periphery LP and the right periphery RP overlap the bit line BL, and do not overlap the write line WT in plan view.

Then, a description will be given to the operation of the memory cell region MR in the present embodiment.

Referring to FIG. 4 again, the read operation is performed in the following manner. A prescribed current is passed through the ferromagnetic tunneling junction element MM of a specific memory cell. Thus, the difference in resistance value due to the direction of magnetization in the recording layer 3 is detected. First, the selecting transistor TR of a specific memory cell MC (see FIG. 2) is put in an ON state. Thus, a prescribed sense signal is transmitted from the bit line EL through a specific ferromagnetic tunneling junction element MM to the source line SL (see FIG. 2) via the coupling members 18, 16, and 14 and the selecting transistor TR.

At this time, when the directions of magnetization in the recording layer 3 and the fixed layer 1 in the ferromagnetic tunneling junction element MM are the same directions, the resistance value is relatively low. When the directions of magnetization in the recording layer 3 and the fixed layer 1 are opposite directions to each other, the resistance value is relatively high. The tunneling magnetoresistive effect element has the following characteristics: when respective magnetization directions in the recording layer 3 and the fixed layer 1 are the same, the resistance value is small; and when respective magnetization directions in the recording layer 3 and the fixed layer 1 are opposite to each other, the resistance value is large.

As a result, when the directions of magnetization in the ferromagnetic tunneling junction element MM are the same, the intensity of the sense signal flowing through the source line SL is larger than the signal intensity of a prescribed reference memory cell. On the other hand, when the directions of magnetization in the ferromagnetic tunneling junction element MM are opposite to each other, the intensity of the sense signal is smaller than the signal intensity of a prescribed reference memory cell. Thus, whether the information written into a specific memory cell is "0" or "1" is determined by whether the intensity of the sense signal is larger or smaller than the signal intensity of the prescribed reference memory cell.

The write (rewrite) operation is performed in the following manner. A prescribed current is passed through the bit line BL and the write line WT, thereby to magnetize (reverse the magnetization of) the ferromagnetic tunneling junction element MM. First, a prescribed current is passed through each of the selected bit line BL and write line WT, resulting in the generation of magnetic fields (magnetic fields in the directions indicated with arrows 53a and 54a of FIG. 10) corresponding to the directions of flow of respective currents around the bit line BL and the write line WT. A synthetic magnetic field of the magnetic field generated by the current flowing through the bit line BL and the magnetic field generated by the current flowing through the write line WT (the magnetic field in the direction indicated with an arrow 55a of FIG. 10) acts on the ferromagnetic tunneling junction element MM situated in a region in which the selected bit line BL and write line WT cross each other.

At this time, the synthetic magnetic field 55a causes a mode in which the recording layer 3 of the ferromagnetic tunneling junction element MM is magnetized in the same direction as the direction of magnetization in the fixed layer 1, and a mode in which the recording layer 3 is magnetized in the opposite direction to the direction of magnetization in the fixed layer 1. Thus, the case where the directions of magnetization in the recording layer 3 and the fixed layer 1 are the same and the case where the directions are opposite to each other are implemented. This results in that the direction of the magnetization is recorded as information corresponding to "0" or "1".

Then, one example of methods for manufacturing each MRAM shown in FIGS. 4 to 11 as a magnetic storage device of the present embodiment will be described by reference to FIGS. 12 to 17.

Figure 12:
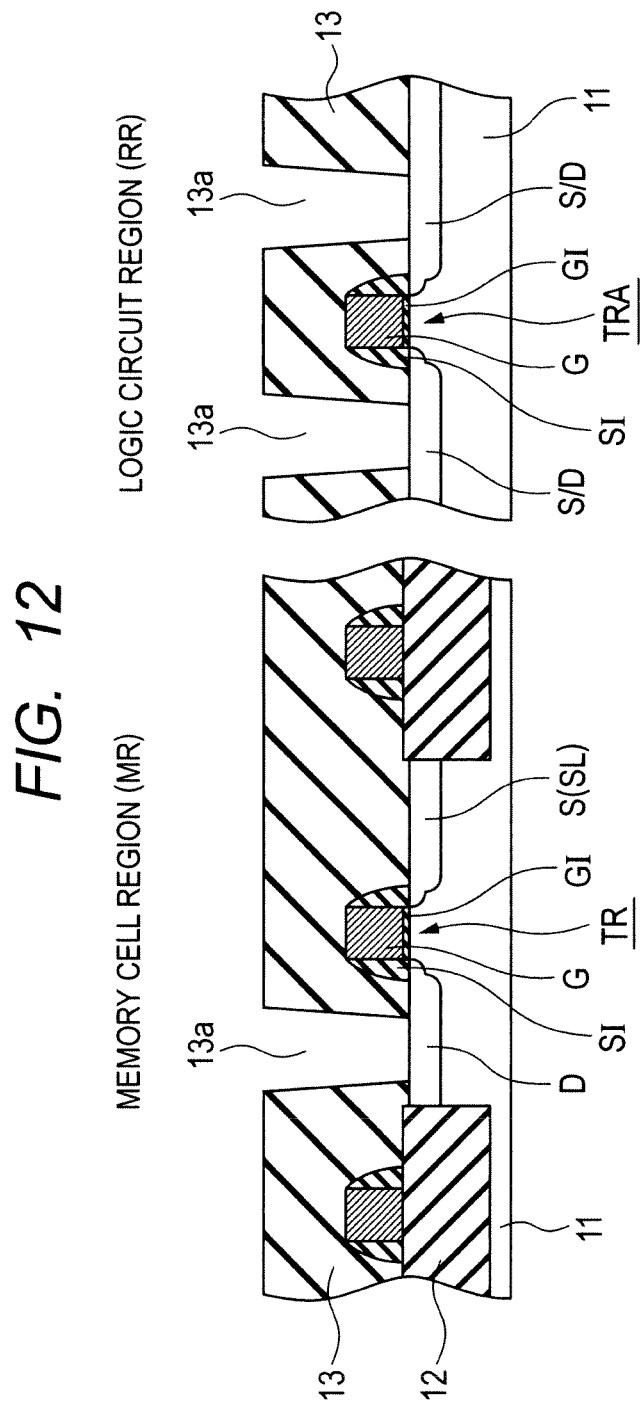
FIG. 12 is a schematic cross-sectional view showing a first step of a method for manufacturing a magnetic storage device in the first embodiment of the present invention.

Referring to FIG. 12, in a prescribed region in a main surface of a semiconductor substrate 11, an element isolation insulation film 12 formed of a silicon oxide film is formed by, for example, a thermal oxidation method. Thus, a memory cell region MR and a logic circuit region RR are formed. Over the surface of the semiconductor substrate 11 situated in the memory cell region MR and the logic circuit region RR, a gate insulation film GI and a gate electrode main body G are formed in this order. With the gate electrode main body G and the like as a mask, impurities of a prescribed conductivity type are injected into the surface of the semiconductor substrate 11. As a result, there are formed a pair of source region S/drain region D formed of impurity regions. By the procedure up to this point, in the memory cell region MR, there is formed the element selecting transistor TR including the gate electrode G, the drain region D and the source region S. In the peripheral (logic) circuit region RR, there is formed a transistor TRA forming the logic circuit.

In such a manner as to cover the element selecting transistor TR and the transistor TRA from above, the interlayer insulation film 13 is formed with, for example, a CVD (Chemical Vapor Deposition) method. The interlayer insulation film 13 is subjected to general photomechanical process and etching. This results in the formation of contact holes 13a and 13b exposing the surface of the semiconductor substrate 11.

Then, by a sputtering method or the like, a barrier metal (the diagonally shaded portion of FIG. 12) is formed over the inner surfaces (the side surfaces and the bottom surfaces of the inner sides) of the contact holes 13a and 13b. Specifically, over the interlayer insulation film 13 including the inner surfaces, a thin film of tantalum or titanium nitride (not shown) is formed. Then, the thin film is subjected to a CMP (Chemical Mechanical Polishing) processing. As a result, portions of a thin film not shown situated over the top surface of the interlayer insulation film 13 are removed. By the removal of the thin film, other portions of the thin film are left over respective inner surfaces in the contact holes 13a and 13b. Accordingly, the barrier metal is formed.

After the formation of the barrier metal, for example, a tungsten layer (not shown) is formed over the interlayer insulation film 13 by, for example, a CVD method. The tungsten layer is subjected to a CMP processing. This results in removal of portions of the tungsten layer not shown situated over the top surface of the interlayer insulation film 13.

Figure 13:
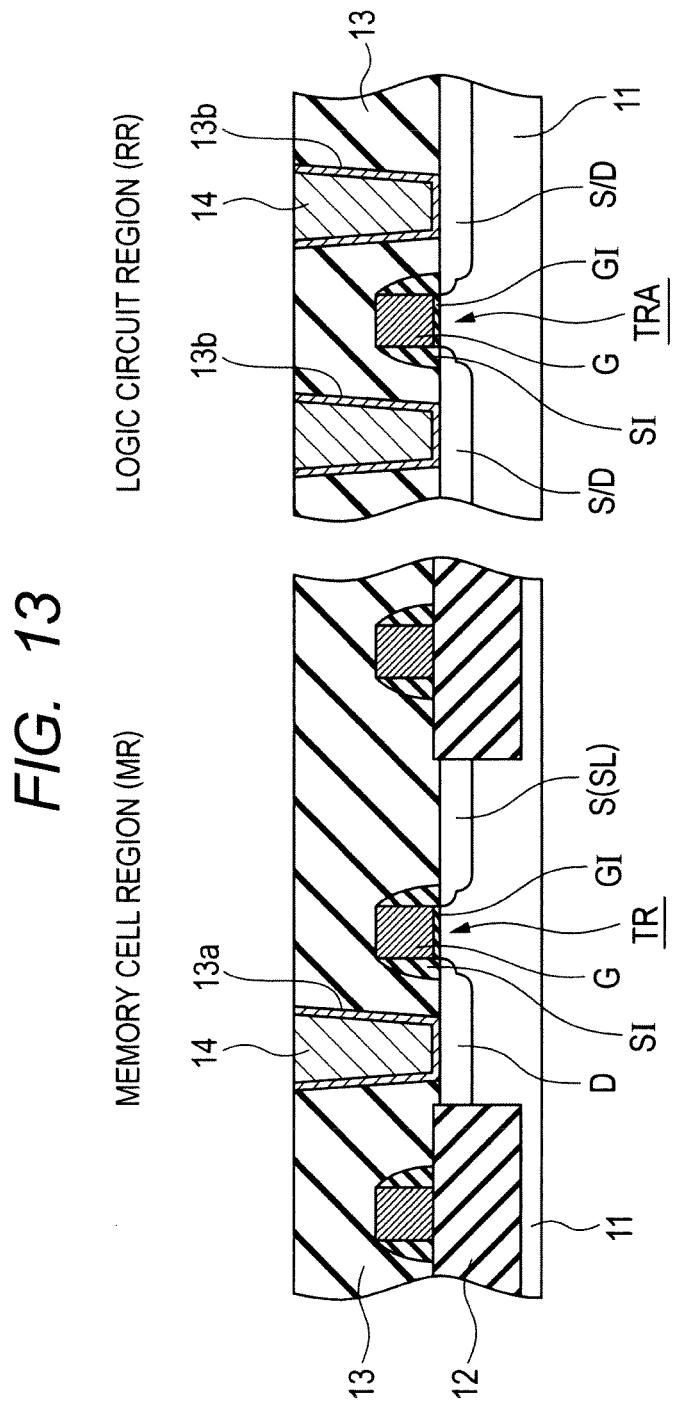
FIG. 13 is a schematic cross-sectional view showing a second step of the method for manufacturing a magnetic storage device in the first embodiment of the present invention.

Referring to FIG. 13, by the removal of the tungsten layer, the tungsten layer is filled in such a manner as to be left in each of the contact holes 13a and 13b. Accordingly, the coupling member 14 is formed.

Figure 14:
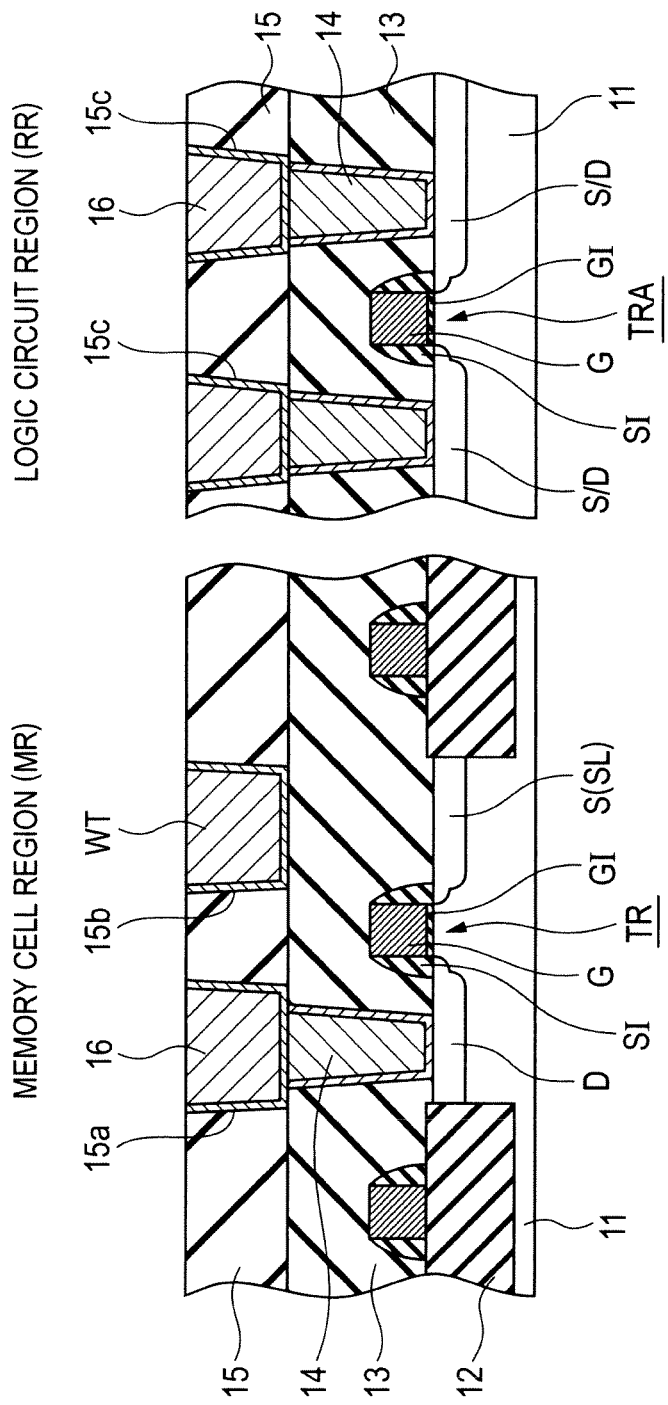
FIG. 14 is a schematic cross-sectional view showing a third step of the method for manufacturing a magnetic storage device in the first embodiment of the present invention.

Referring to FIG. 14, with, for example, a CVD method, over the interlayer insulation film 13, further an interlayer insulation film 15 is formed. The interlayer insulation film 15 is subjected to general photomechanical process and etching. As a result, in the memory cell region MR, there are formed openings 15a and 15b for forming the write lines and prescribed wiring layers. Whereas, in the peripheral circuit region RR, an opening 15c for forming a prescribed wiring layer is formed in the interlayer insulation film 15. By sputtering or the like, in the inner surfaces of the openings 15a, 15b, and 15c, a barrier metal is formed. Then, in such a manner as to fill the openings 15a, 15b, and 15c, a thin film of, for example, copper (not shown) is formed over the interlayer insulation film 15 by, for example, a plating method. The thin film of copper is subjected to a CMP processing. Resultantly, portions of the copper thin film situated over the top surface of the interlayer insulation film 15 are removed. Accordingly, other portions of the copper thin film are left in the openings 15a, 15b, and 15c. As a result, in the memory cell region MR, the wiring layer 16 is formed in the opening 15a, and the write line WT is formed in the opening 15b. Whereas, in the peripheral circuit region RR, the wiring layer 16 is formed in the opening 15c.

Figure 15:
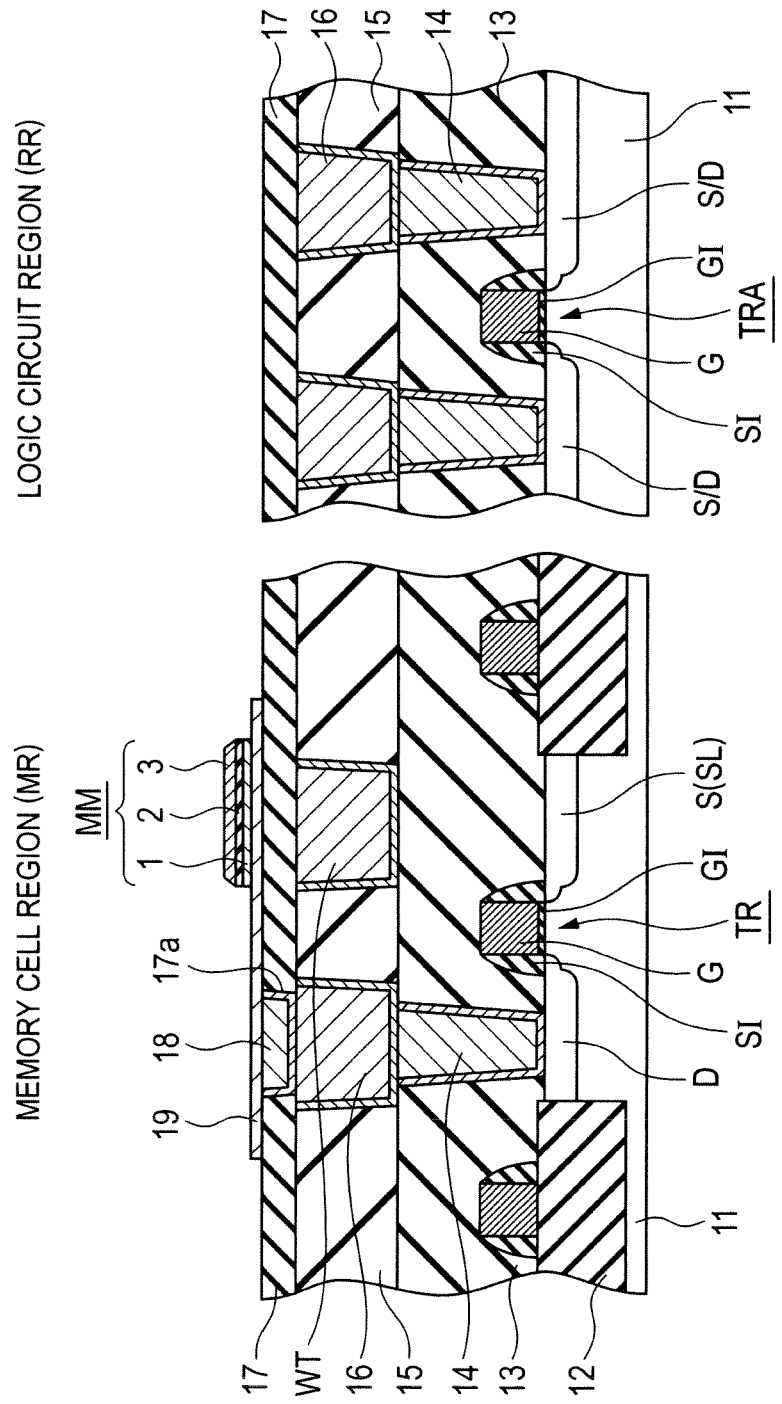
FIG. 15 is a schematic cross-sectional view showing a fourth step of the method for manufacturing a magnetic storage device in the first embodiment of the present invention.

Referring to FIG. 15, over the interlayer insulation film 15, an interlayer insulation film 17 is further formed by, for example, a CVD method. The interlayer insulation film 17 preferably includes, for example, a silicon nitride film and a silicon oxide film stacked in this order. The interlayer insulation film 17 is subjected to general photomechanical process and etching. This results in the formation of a contact hole 17a exposing the surface of the wiring layer 16. By the same procedure as that described above, the inner surface of the contact hole 17a is filled with a barrier metal. The thin film of copper is filled in the contact hole 17a, resulting in the formation of the coupling member 18.

Then, over the interlayer insulation film 17 in the memory cell region MR, a conductive layer 19 and a ferromagnetic tunneling junction element MM are formed. By deposition, general photomechanical process, and etching, the conductive layer 19 as a thin film formed of, for example, copper or tantalum is formed. Then, a multilayer film of a fixed layer 1, a tunneling insulation layer 2, and a recording layer 3 is formed in such a manner as to cover some region over the conductive layer 19. As a film to be the fixed layer 1, there are successively formed, for example, a platinum manganese alloy film (antiferromagnetic layer) with a film thickness of about 20 nm and a cobalt iron alloy film (ferromagnetic layer) with a film thickness of about 3 nm. Then, as a film to be the tunneling insulation layer 2, there is formed, for example, an aluminum oxide film with a film thickness of about 1 nm. Then, as the recording layer 3, there is formed, for example, a nickel iron alloy film with a film thickness of about 3 nm (both not shown). Incidentally, the platinum manganese film, the cobalt alloy film, the aluminum oxide film, and the nickel alloy film are formed by, for example, a sputtering method. Any of the thicknesses of respective thin films described above is one example.

The multilayer structure of the fixed layer 1, the tunneling insulation layer 2, and the recording layer 3 is subjected to general photomechanical process and etching. This results in the formation of the ferromagnetic tunneling junction element MM in a prescribed shape, including the fixed layer 1, the tunneling insulation layer 2, and the recording layer 3. Generally, when a dry process (ashing) is used in resist pattern removal after etching, a gas containing oxygen as a main component is used. Preferably, using gases not oxidative with respect to the constituent materials of the fixed layer 1 and the recording layer 3 such as hydrogen, nitrogen, and ammonia, and a mixed gas thereof, the oxidation of the fixed layer 1 and the recording layer 3 is inhibited.

In the present embodiment, under the ferromagnetic tunneling junction element MM, there are formed two layers of the interlayer insulation films 13 and 15 of silicon oxide films. However, the number of layers of the interlayer insulation films is arbitrary. For example, it is also acceptable that three or more layers of interlayer insulation films are stacked.

Figure 16:
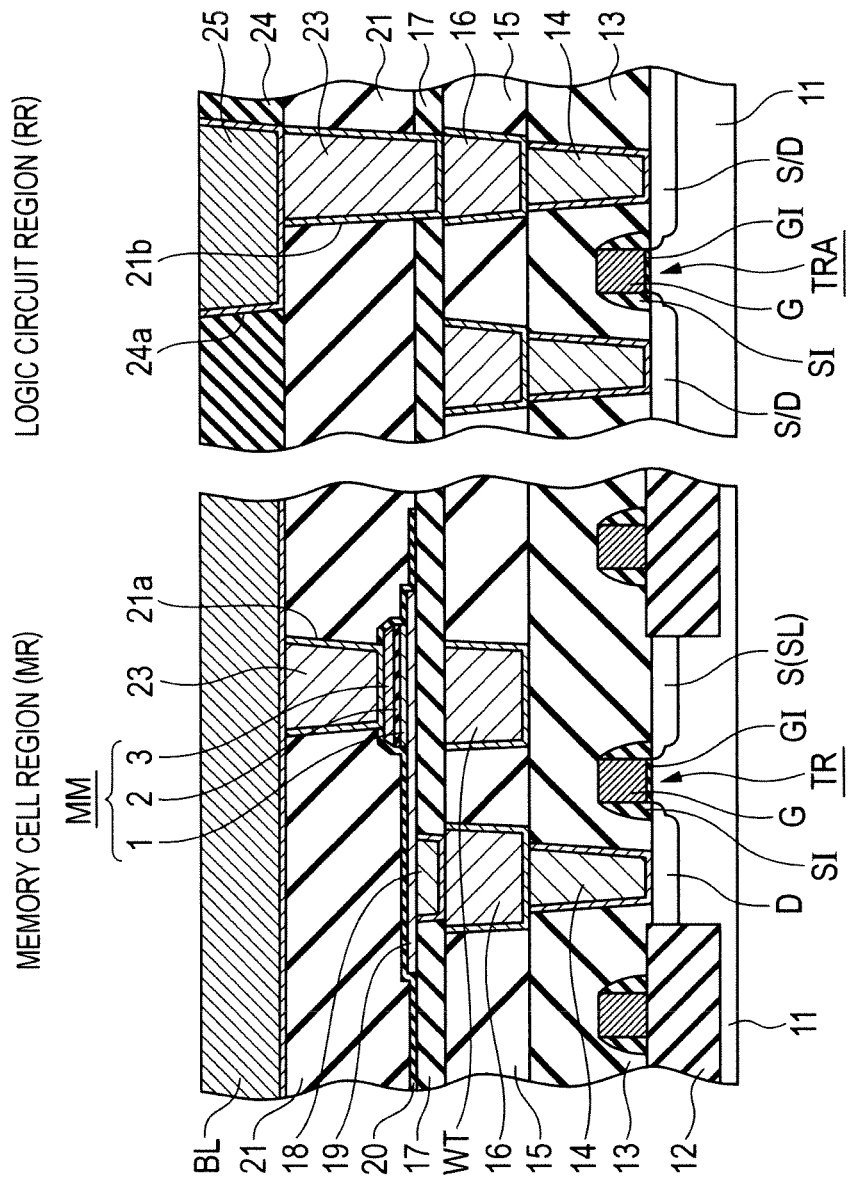
FIG. 16 is a schematic cross-sectional view showing a fifth step of the method for manufacturing a magnetic storage device in the first embodiment of the present invention.

Referring to FIG. 16, a protective film 20 is formed in such a manner as to cover the top surface and the side surface of the formed ferromagnetic tunneling junction element MM. The protective film 20 is formed in order to inhibit the ferromagnetic tunneling junction element MM from being damaged in the post step or during use. An interlayer insulation film 21 is further formed by, for example, a CVD method, over the interlayer insulation film 17 in such a manner as to cover the protective film 20. The interlayer insulation film 21 is formed with the same materials as those of the interlayer insulation films 13 and 15 in the same manner as therewith.

In the memory cell region MR, the interlayer insulation film and the protective film 20 are subjected to general photomechanical process and etching. This results in the formation of a contact hole 21 exposing the surface of the recording layer 3. Whereas, in the peripheral circuit region RR, the interlayer insulation film 21 and the interlayer insulation film 17 are subjected to general photomechanical process and etching. This results in the formation of a contact hole 21b reaching the surface of the wiring layer 16. In the contact holes 21a and 21b, a barrier metal and a filling thin film of copper are formed in the same manner as described above, resulting in the formation of a coupling member 23.

An interlayer insulation film 24 is formed by, for example, a CVD method in such a manner as to cover the interlayer insulation film 21 from above. The interlayer insulation film 21 is formed with the same materials as those of the interlayer insulation films 13 and 15 in the same manner as therewith. The interlayer insulation film 24 is subjected to general photomechanical process and etching. As a result, in the memory cell region MR, an opening for forming a bit line is formed in the interlayer insulation film 24. In the peripheral circuit region RR, an opening 24a is formed in the interlayer insulation film 24. In the opening for forming the bit line and the opening 24a, a barrier metal and a filling thin film of copper are formed in the same manner as described above. As a result, a bit line BL and a wiring layer 25 are formed.

In the foregoing description, there is used a so-called single damascene method as follows: the opening and the contact hole formed in a one-layer interlayer insulation film formed of a silicon oxide film is filled with a thin film of copper or the like, and portions of the thin film of copper over the interlayer insulation film are removed by a CMP processing. However, the coupling member and the wiring layer may be formed by a so-called dual damascene method as follows: for example, after the formation of the interlayer insulation film 21, an interlayer insulation film 24 to be stacked thereover is successively formed; subsequently, their respective contact holes and openings are formed; and both of the contact holes and the openings are filled with a metal thin film at the same time.

Specifically, the interlayer insulation film 21 and the interlayer insulation film 24 are successively formed. Then, the interlayer insulation film 24 is subjected to general photomechanical process and etching, resulting in the formation of the opening 24a and the like. Then, the interlayer insulation film 21 is subjected to general photomechanical process and etching, resulting in the formation of the contact hole 21a and the like. Incidentally, the opening 24a and the like may be formed in the interlayer insulation film 24 after the formation of the contact holes in the interlayer insulation films 21 and 24.

Then, in both of the contact holes and the openings in the interlayer insulation film 21 and the interlayer insulation film 24, barrier metals and filling thin films of copper are formed in the same manner as described above at a time. With this configuration, the bit line BL, the coupling member 23, and the wiring layer 25 are formed at a time.

Incidentally, in the memory cell region MR, the coupling member 23 for electrically coupling the bit line BL and the ferromagnetic tunneling junction element MM is not required to be disposed. For example, the following configuration may be adopted: the bit line BL and the ferromagnetic tunneling junction element MM are in direct contact with each other, and thereby both are electrically coupled with each other. In the logic circuit region RR, the coupling member 23 to be electrically coupled with the wiring layer 16 is formed in the contact hole 21b, and the wiring layer 25 to be electrically coupled with the coupling member 23 is formed in the opening 24a.

Figure 17:
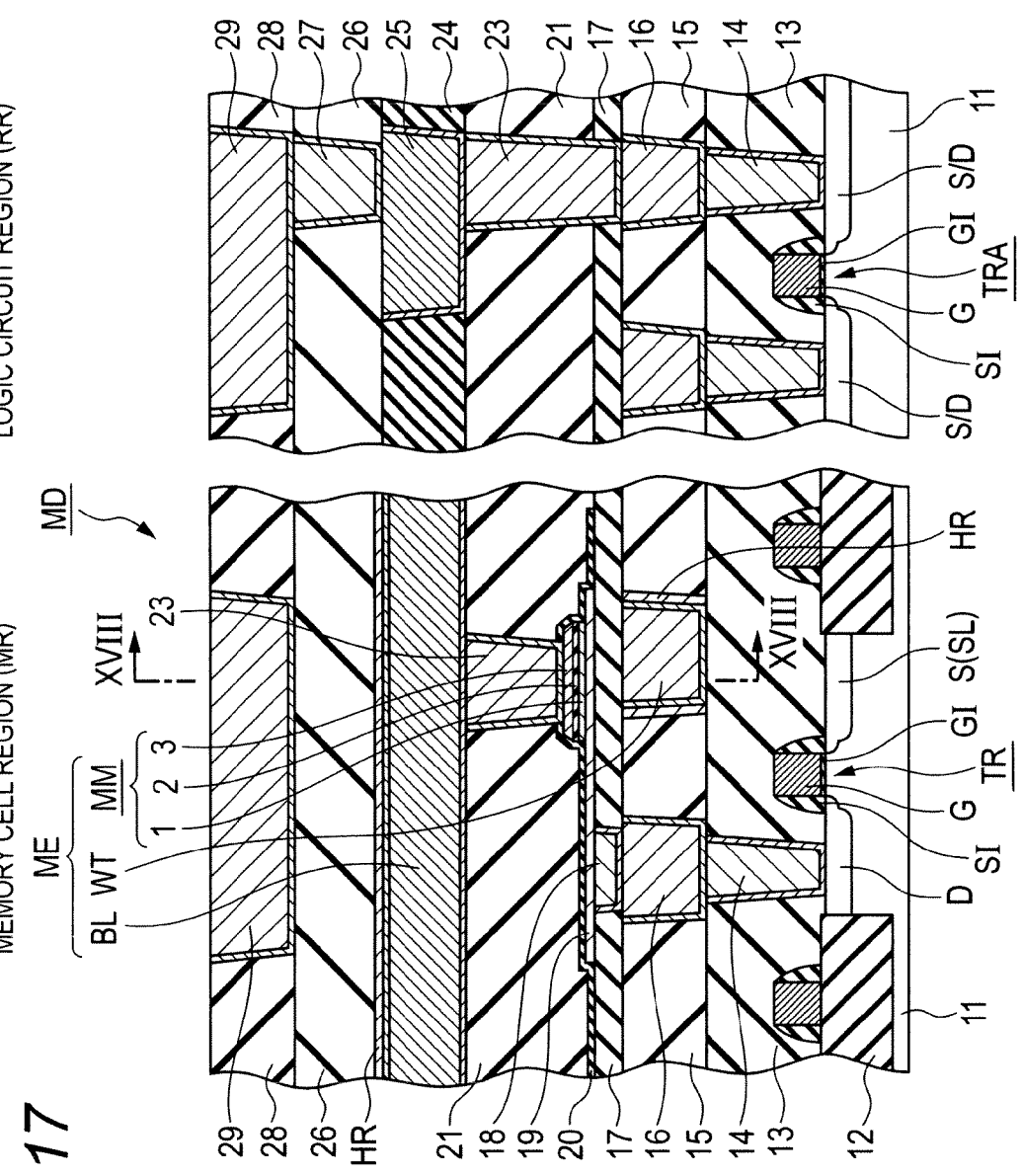
FIG. 17 is a schematic cross-sectional view showing a sixth step of the method for manufacturing a magnetic storage device in the first embodiment of the present invention.

Referring to FIG. 17, an interlayer insulation film 26 is formed over the interlayer insulation film 24 in such a manner as to cover the bit line BL and the wiring layer 25. The interlayer insulation film 26 is formed with the same materials as those of the interlayer insulation films 13 and 15 in the same manner as therewith. In the peripheral circuit region RR, the interlayer insulation film 26 is subjected to general photomechanical process and etching, resulting in the formation of a hole. In the hole, a barrier metal and a filling thin film of copper are formed, resulting in the formation of the coupling member 27.

Over the interlayer insulation film 26, an interlayer insulation film 28 is formed. The interlayer insulation film 28 is formed with the same materials as those of the interlayer insulation films 13 and 15 in the same manner as therewith. In the interlayer insulation film 28, in the same manner as described above, an opening is formed, and a wiring layer 29 is formed in the opening.

For the step shown in FIG. 17, the single damascene method was described above. However, the coupling member 27 and the wiring layer 29 may be formed by the dual damascene method as follows: after the formation of the interlayer insulation film 26, an interlayer insulation film 28 to be stacked thereover is formed successively; then, in both of the interlayer insulation films 26 and 28, holes and openings are formed.

In the foregoing manner, the magnetic storage device MD of the present embodiment is formed.

Figure 18:
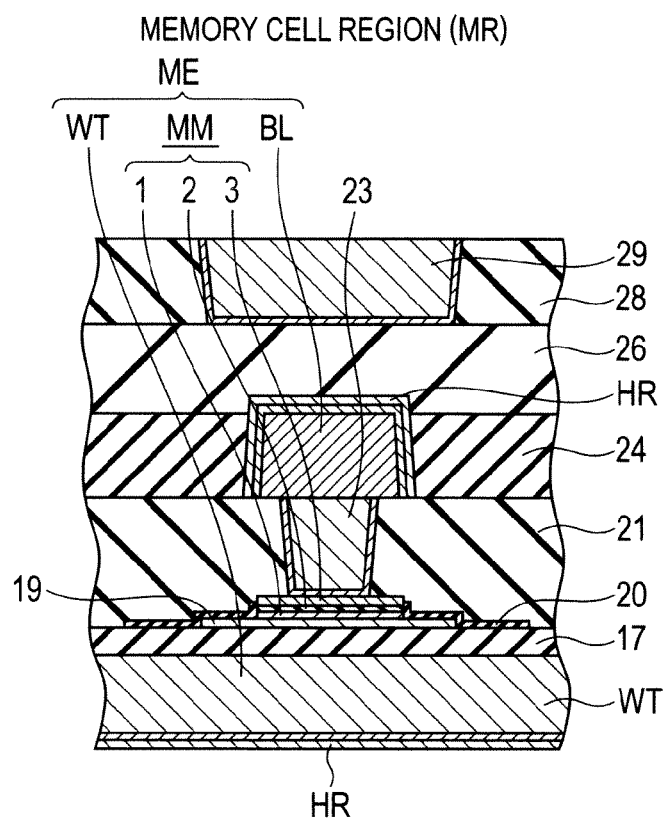
FIG. 18 is a schematic cross-sectional view at a portion along line XVIII-XVIII of FIG. 17.

Referring to FIGS. 17 and 18, in FIG. 17, at the side surface and the bottom surface of the write line WT, a covering layer HR is formed by, for example, a sputtering method with the barrier metal. Whereas, in FIGS. 17 and 18, at the side surface and the top surface of the bit line BL, a covering layer HR is formed with the barrier metal. Thus, more preferably, the side surface, and at least either of the top surface or the bottom surface of the write line WT or the bit line BL in cross sections crossing in the direction of extension of the write line WT or the bit line BT are covered with the covering layer HR.

The covering layer HR is preferably a thin film having a higher magnetic permeability than that of copper when the conductive material forming the write line WT or the bit line BL is, for example, copper. Specifically, there is preferably used at least one selected from the group consisting of alloys or amorphous alloys such as NiFe (nickel iron), NiFeMo, CoNbZr (cobalt niobium zirconium), CoFeNb, CoFeSiB, CoNbRu, CoNbZrMoCr, and CoZrCrMo.

Then, a description will be given to a modified example of the method for manufacturing a magnetic storage device MD of the present embodiment.

In the method for manufacturing a magnetic storage device MD of the present embodiment, as the material forming the coupling member 14, a thin film formed of tungsten was taken as an example. However, for example, silicon may be applied. Alternatively, a metal such as titanium or tantalum may be applied. Further, an alloy of such metals, a nitride of such metals, or the like may be applied. Whereas, as the conductive layers above the coupling member 14, such as the wiring layer 16 and the coupling member 23, thin films formed of copper were taken as examples. However, for example, silicon may be applied. Alternatively, a metal such as titanium or tantalum may be applied.

In the method for manufacturing a magnetic storage device MD, as the methods for forming the coupling member 14, the wiring layer 16, and the like, the CVD method, the plating method, and the CMP method were taken as examples. However, for example, the sputtering method and the plating method may be combined. When copper is applied as a metal, a so-called damascene method can be applied. When the dual damascene method is used, the coupling member and the wiring layer can be formed at a time.

Whereas, as the formation method of the write line WT, the single damascene method was taken as an example. However, when the write line WT is formed with the coupling member at a time, the dual damascene method may be applied. Further, As the wiring materials for the write line WT and the coupling member 14 formed at a time by the dual damascene method, there may be applied metals such as silicon, tungsten, aluminum, and titanium, alloys of such metals, and compounds of such metals. With this configuration, it is possible to form the write line WT and the coupling member 14 by dry etching.

The film thickness of the interlayer insulation film 13, 15, 21, 24, or the like formed of, for example, a silicon oxide film varies according to the applied device. However, in the magnetic storage device MD of the present embodiment, the film thickness is preferably, for example, about 40 nm.

In the method for manufacturing the magnetic storage device MD, as the material forming the tunneling insulation layer 2 of the ferromagnetic tunneling junction element MM, aluminum oxide is taken as an example. However, as the tunneling insulation layer 2, a non-magnetic metal material is preferably used. The tunneling insulation layer 2 is preferably formed of at least one selected from the group consisting of oxides of metals such as aluminum, magnesium, silicon, and tantalum, nitrides of the metal, an alloy oxide of the metal typified by silicate and the like, or nitrides of the alloys.

The tunneling insulation layer 2 is preferably formed as a relatively thin film with a film thickness of about 0.3 to 5 nm in order to obtain appropriate resistance value and resistance change ratio for the read operation. Incidentally, when a thin film of a non-magnetic metal material is used in place of a thin film of aluminum oxide as the tunneling insulation layer 2, a so-called giant magnetoresistance effect can be used.

In the method for manufacturing the magnetic storage device MD, as the material forming the fixed layer 1 of the ferromagnetic tunneling junction element MM, a multilayer structure of a platinum manganese alloy film and a cobalt iron alloy film is taken as an example. As the material forming the recording layer 3, a nickel iron alloy film is taken as an example, However, for the materials forming the fixed layer 1 and the recording layer 3, it is preferable to use ferromagnetic materials each containing, for example, nickel, iron, and/or cobalt as a main component. Further, for the improvement of the magnetic characteristics and the thermal stabilization of the ferromagnetic materials forming the fixed layer 1 and the recording layer 3, additives such as boron, nitrogen, silicon, and molybdenum may be introduced into the ferromagnetic materials. Particularly, the recording layer 3 can also be improved/stabilized in magnetic characteristics by: stacking a crystalline material thin film having a crystal structure of a body-centered cubic type, a rutile type, a sodium chloride type, or a zincblende type, for improving the magnetic characteristics of the recording layer 3; and/or stacking an antioxidant film of tantalum, ruthenium, or the like, over the recording layer 3; and/or the like. Further, as the materials forming the fixed layer 1 and the recording layer 3, there can also be applied at least one selected from the group consisting of NiMnSb, $Co_2Mn(Ge, Si)$, $Co_2Fe(Al, Si)$, $(Zn, Mn)Fe_2O_4$, and the like called half metals. In the half metal, an energy gap is present in one spin band, which can provide a very large magnetic effect. As a result, a large signal output can be obtained.

The fixed layer 1 is formed in a multilayer structure of an antiferromagnetic layer and a ferromagnetic layer, and hence can be more fixed in magnetization direction. In other words, the antiferromagnetic layer fixes the spin orientation in the ferromagnetic layer, so that the direction of magnetization in the ferromagnetic layer is held constant. The antiferromagnetic layer is preferably a compound of at least one of ferromagnetic materials such as iron or noble metals, and manganese. The fixed layer 1 may be in, but is not limited to a two-layer structure in which a ferromagnetic layer is stacked over the antiferromagnetic layer. The fixed layer 1 may be in a four-layer structure in which a ferromagnetic layer, a non-magnetic layer, and a ferromagnetic layer are stacked in this order over an antiferromagnetic layer, a five-layer structure, or the like. The number of stacked layers, the order of kinds of the layers to be stacked, and the like are not limited to the foregoing mode. The recording layer 3 is also not limited to a one-layer structure, and may also be, for example, in a structure in which two or more ferromagnetic layers different in magnetic characteristics are stacked. Alternatively, the recording layer 3 may be, for example, in a three-layer structure in which a ferromagnetic layer, a non-magnetic layer, and a ferromagnetic layer are stacked in this order. The number of stacked layers, the order of kinds of the layers to be stacked, and the like are not limited to the foregoing mode.

In the method for manufacturing the magnetic storage device MD, the case where the fixed layer 1, the tunneling insulation layer 2, and the recording layer 3 are formed by a sputtering method, respectively, is taken as an example. However, the fixed layer 1, the tunneling insulation layer 2, and the recording layer 3 may be respectively formed by, for example, a MBE (Molecular Beam Epitaxy) method, a chemical vapor deposition method, or a vapor deposition method in place of a sputtering method.

Further, in the method for manufacturing the magnetic recording device MD, a description is given to the case where the conductive layer 19 is present between the fixed layer 1 of the ferromagnetic tunneling junction element MM and the coupling member 18. However, the fixed layer 1 and the coupling member 18 may be directly coupled with each other. Alternatively, the wiring layer 16 and the conductive layer 19 may be directly coupled without interposing the coupling member 18 therebetween. In this case, the conductive layer 19 may be formed in the same shape as the planar shape of the fixed layer 1 in such a manner as to overlap the fixed layer 1 in plan view. As the material forming the conductive layer 19, other than copper or tantalum described above, there may be applied a low-resistance metal such as platinum, ruthenium, or aluminum. Further, the film thickness of the conductive layer 19 is preferably set at, for example, 300 nm or less so that the flatnesses of the fixed layer 1, the tunneling insulation layer 2, and the recording layer 3 formed over the conductive layer 19 are not impaired.

Incidentally, when the fixed layer 1 is formed with the same size as that of the recording layer 3 in plan view, the conductive layer 19 is required to be formed larger than the fixed layer 1 in plan view such that the conductive layer 19 is coupled with the coupling member 14. This is because the ferromagnetic tunneling junction element MM such as the fixed layer 1 is generally disposed at a position not overlapping the coupling member 14 and the wiring layer 16 in plan view. In this case, the conductive layer 19 may be formed larger than the fixed layer 1 in plan view.

By thus interposing the prescribed conductive layer 19 between the interlayer insulation film 15 and the ferromagnetic tunneling junction element MM, the following effects are exerted. Namely, when the ferromagnetic tunneling junction element MM is patterned by etching, the conductive layer 19 functions as a barrier for inhibiting the coupling member 18 of copper on the bottom side of the conductive layer 19 from being etched and corroded. Further, by applying a material having a lower resistance value than the resistance value of the fixed layer 1 as the material forming the conductive layer 19, it is possible to reduce the resistance value of the path of the current for reading. This can also improve the reading speed.

In the method for manufacturing the magnetic storage device MD of the present embodiment, in order to inhibit the ferromagnetic tunneling junction element MM from being damaged in steps after the formation of the ferromagnetic tunneling junction element MM, a protective film 20 is formed in such a manner as to cover the ferromagnetic tunneling junction element MM. In the manufacturing steps, the ferromagnetic tunneling junction element MM is damaged, for example, by the heat treatment for forming the interlayer insulation film. When a silicon oxide film is formed as the interlayer insulation film, the silicon oxide film is formed under an about 300 to 400° C. oxidizing atmosphere.

At this step, the magnetic film may be oxidized under the oxidizing atmosphere. This may deteriorate the magnetic characteristics of the ferromagnetic tunneling junction element Thus, the protective film 20 covering the ferromagnetic tunneling junction element MM, and formed of a silicon nitride film or an aluminum nitride film functions as a barrier for inhibiting the oxidation of the ferromagnetic tunneling junction element MM. Accordingly, the protective film 20 can protect the ferromagnetic tunneling junction element MM.

Alternatively, the interlayer insulation film 21 formed at the same layer as the ferromagnetic tunneling junction element MM in order to inhibit the oxidation of the ferromagnetic tunneling junction element MM as described above may be formed in a two-layer structure of a thin film depositable under a non-oxidizing atmosphere such as a silicon nitride film, and an oxidizing insulation film such as a silicon oxide film. In this case, the silicon nitride film of the interlayer insulation film in a two-layer structure becomes the protective film for the ferromagnetic tunneling junction element MM.

Further, the materials forming the protective film 20 preferably include at least one material of an insulating metal nitride, an insulating metal carbide, and a metal oxide formed by an oxidation treatment of a metal having a lower oxidation generation free energy than that of iron. By using such materials, it is possible to at least inhibit the oxidation of the ferromagnetic tunneling junction element MM during the oxidation step in the manufacturing steps of the magnetic storage device using a magnetic material thin film including iron. As a result, it is possible to obtain a magnetic storage device easy to manufacture and stable in operation characteristics.

Then, referring to FIGS. 19 to 24, the advantageous effects of the present embodiment will be described.

First, a consideration will be given to other magnetic storage elements ME than a magnetic storage element ME to be subjected to writing of information therein in the write operation, which are coupled with the same write line WT as the write line WT coupled with the magnetic storage element ME.

Figure 19:
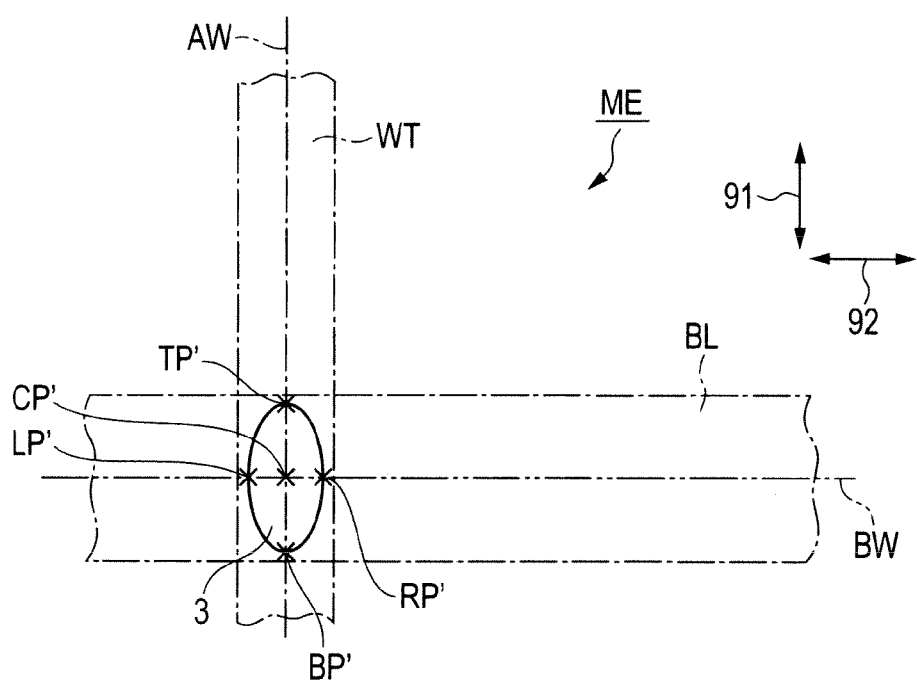
FIG. 19 is a schematic plan view showing the positional relationship between a recording layer and wiring of a magnetic storage element in a first comparative example of the first embodiment of the present invention.

Referring to FIG. 19, each recording layer 3 forming the other magnetic storage elements ME, which is a first comparative example of the present embodiment has an ellipse shape in plan view. The recording layer 3 of FIG. 19 is different from the magnetic storage element ME of FIG. 10 in accordance with the present embodiment in that the entire region in plan view including the endpoints such as the top periphery TP', the bottom periphery BP', the left periphery LP', and the right periphery RP' overlaps both of the write line WT and the bit line BL. The comparative example of FIG. 19 is equal in configuration to the present embodiment shown in FIG. 10 in other respects than those described above. Therefore, the same elements are given the same reference numerals and signs, and a description thereon will not be repeated.

Figure 20:
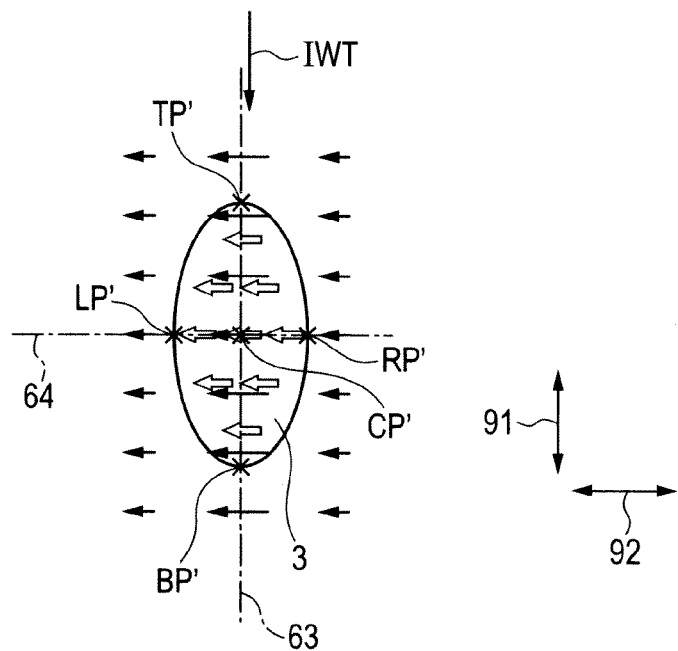
FIG. 20 is a schematic plan view showing the distribution of magnetization when a recording layer of FIG. 19 other than a recording layer in which information is to be written is put in a semi-selected state by a write line current coupled with a magnetic storage element in which information is to be written in a magnetic storage device including the recording layer of FIG. 19.

Referring to FIG. 20, a consideration will be given to the case where a magnetic field due to a sufficiently large write line current IWT flowing through the write line WT electrically coupled with the recording layer 3 of the first comparative example shown in FIG. 19 is generated. In this case, the magnetic storage element ME and the other magnetic storage elements ME are in a semi-selected state by the write line current IWT. In the semi-selected state, the magnetic storage element ME is applied with a magnetic field in the direction (the left-to-right direction of the figure) of the hard axis 92 (roughly orthogonal to the easy axis 91) by the current flowing through the write line WT along the direction of the easy axis 91.

Figure 21:
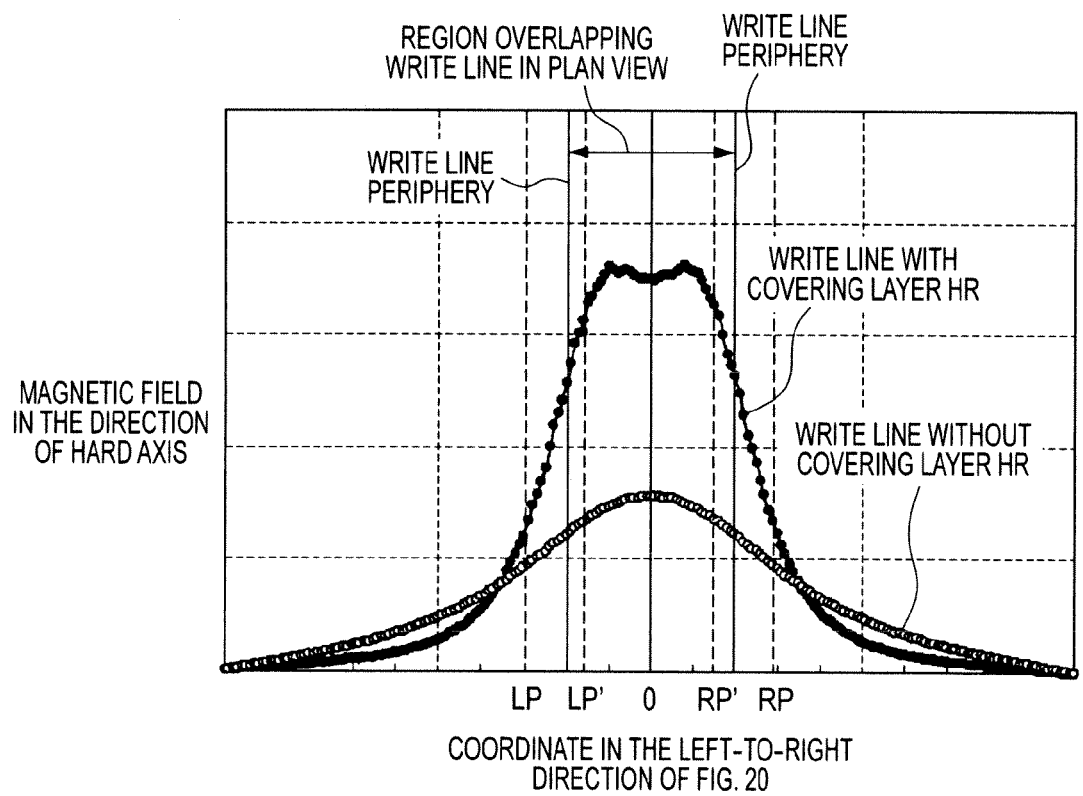
FIG. 21 is a graph showing the relationship between the distance from the center of a write line and the magnetic field in the hard axis direction generated by the write line current.

Herein, the distribution of the magnetic field generated by the write line current IWT will be described by reference to FIG. 21. The horizontal axis of the graph of FIG. 21 indicates, for example, the coordinate in the left-to-right direction in FIG. 20. The point at which the horizontal coordinate of the graph of FIG. 21 is 0 indicates the coordinate in the left-to-right direction in FIG. 20 at a spot at which the first straight line 63 (write center line AW) extends. The vertical axis of the graph of FIG. 21 indicates the magnitude of the magnetic field in the direction of the hard axis 92 (due to the write line current IWT) occurring in each coordinate region. In the recording layer 3 of the present embodiment shown in FIG. 10, the left periphery LP and the right periphery RP do not overlap the write line WT in plan view. In contrast, in the recording layer 3 of the comparative example of FIG. 19 (to be coupled with the same write line WT as that for the recording layer 3 of FIG. 10), the left periphery LP' and the right periphery RP' overlap the write line WT in plan view. Accordingly, these second endpoints are disposed as shown on the horizontal axis of FIG. 21. The ends of the region overlapping the write line in plan view are disposed between the position of LP and LP', and between the position of RP and the position of RP'.

FIG. 21 shows the data of the magnitudes of the magnetic fields in the case where the covering layer HR (see FIGS. 17 and 18) is formed at the side surface and the bottom surface of the write line WT and in the case where the covering layer HR is not formed. The graph of the write line with the covering layer HR and the graph of the write line without the covering layer HR are outputted under entirely the same conditions (such as the size and the material of the conductive layer, and the magnitude of the write line current IWT) except for the presence or absence of the covering layer HR.

The graphs of FIG. 21 indicate that covering of the side surface and the bottom surface of the write line WT with the covering layer HR results in an increase in magnetic field generated by the write line current IWT. This indicates as follows. Provision of the covering layer HR causes the magnetic flux generated from the write line WT to be concentrated, for example, in the vicinity of the recording layer 3, in a higher density. For this reason, when the covering layer HR is formed at the write line WT, the direction of magnetization in the recording layer 3 can be controlled with a higher efficiency without changing the magnitude of the write line current IWT. The covering layer HR formed at the bit line BL also exerts the same effects as with the covering layer HR formed at the write line WT. Namely, when the covering layer HR is formed at the write line WT (bit line BL), the write operation can be caused with high efficiency without increasing the write line current IWT during the write operation.

Then, when the write line without the covering layer HR is used, the magnetic field becomes maximum in a region in which the write center line AW extends, and the magnetic field roughly monotonously decreases as getting away in any of left and right directions of FIG. 20 from the write center line AW. In contrast, when the write line with the covering layer HR is used, in a region over the second straight line 64 and the bit center line BW (in a region between LP' and RP'), for example, overlapping the recording layer 3 of the comparative example of FIG. 19 in plan view, the magnitude of the magnetic field is kept at roughly the maximum state. However, it is indicated as follows: irrespective of the presence or absence of the covering layer HR, inside a pair of write line ends (region interposed between a pair of write line ends) of FIG. 21 which are the ends (in the left-to-right direction of FIG. 20) of the write line WT, the magnetic field is large; and outside the region interposed between a pair of the write line ends, the magnetic filed sharply decreases.

Referring to FIG. 20 again, the recording layer 3 of the comparative example of FIG. 20 entirely overlaps the write line WT in plan view. For this reason, FIG. 21 indicates as follows: when the magnetic field generated by the write line current IWT of the distribution indicated with thin arrows in FIG. 20 is added, as indicated with thick arrows in FIG. 22, the magnetic field applied to the recording layer 3 has roughly a constant magnitude (the magnitude close to the maximum magnitude in the center line AW) irrespective of the distance from the first straight line 63 (the write center line AW), and are roughly uniformly oriented in the direction of the hard axis 92. This state is a state in which the magnetization in the recording layer 3 is saturated roughly entirely in the direction due to the write line current IWT. When the write line current IWT is 0 with the magnetization in the recording layer 3 saturated in the direction due to the write line current IWT, the magnetization direction in the recording layer 3 becomes the direction along the easy axis 91. However, out of the directions along the easy axis 91, the upward direction and the downward direction of FIG. 20 occur each with a probability of ½, so that the magnetization direction (upward direction or downward direction) cannot be controlled. Namely, the magnetization in the recording layer 3 is saturated in the direction of the hard axis 92. As a result, it becomes impossible to control the direction of magnetization in the recording layer 3. This makes it impossible to hold the information of the recording layer 3. Therefore, when the write line current IWT causes a semi-selected state in which the magnetic field of the recording layer is saturated in the direction of the hard axis 92, erroneous data reversal in the recording layer 3 may be caused.

Figure 22:
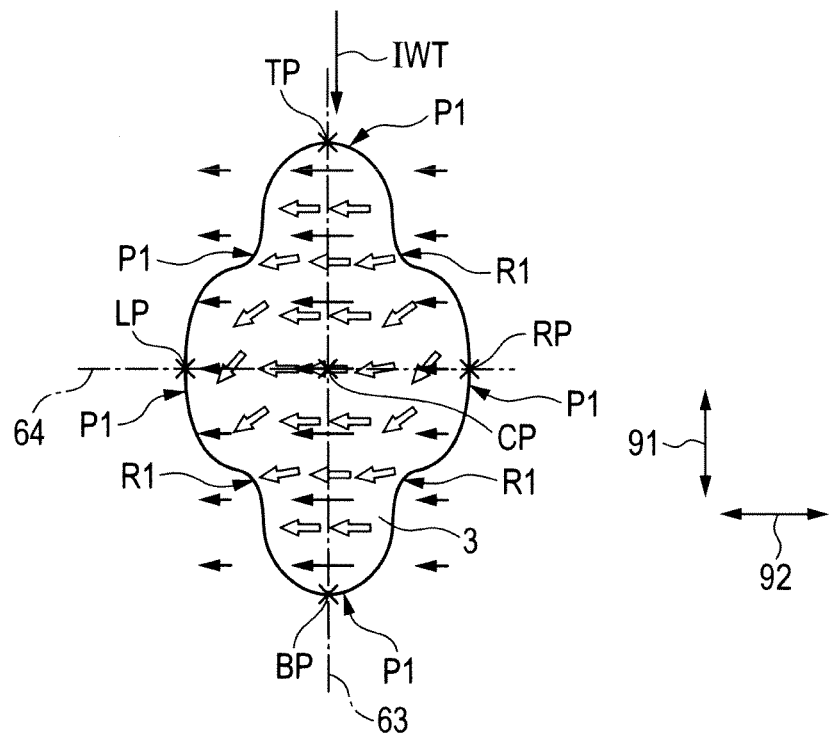
FIG. 22 is a schematic plan view showing the distribution of magnetization when the recording layer shown in FIG. 9 is put in a semi-selected state by the write line current under the same conditions as those for FIG. 20, of the first embodiment of the present invention.
Figure 23:
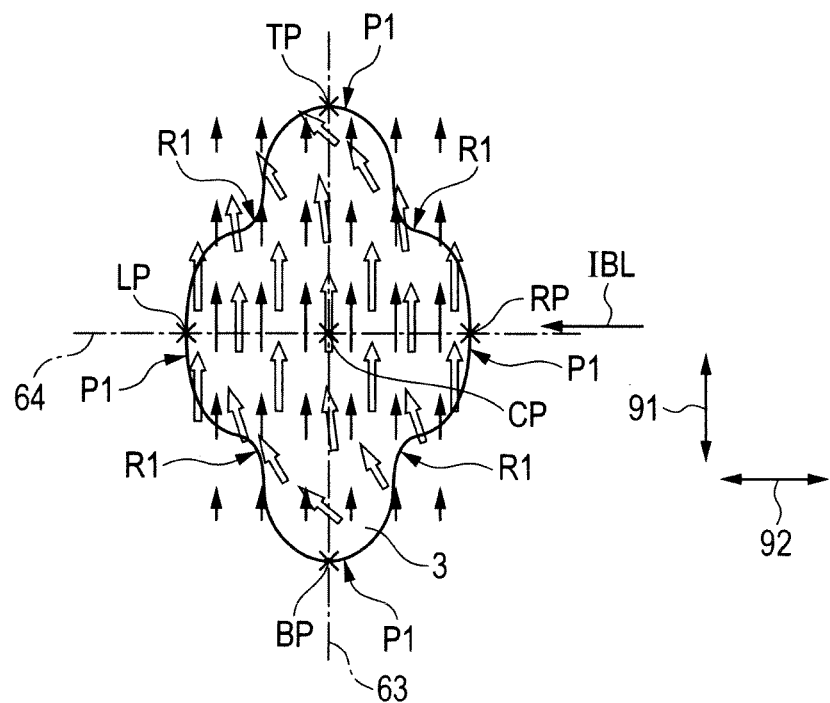
FIG. 23 is a schematic plan view showing the distribution of magnetization when the recording layer shown in FIG. 9 is put in a semi-selected state by the bit line current under the same conditions as those for FIG. 20, of the first embodiment of the present invention.

On the other hand, referring to FIG. 22, when the recording layer 3 of the present embodiment is put in a semi-selected state by the write line current IWT, the magnetic field generated by the write line current IWT of the distribution shown with thin arrows in FIG. 22 also decreases as getting away from the first straight line 63 (write center line AW) (particularly in a region not overlapping the write line WT in plan view) as described above. As a result, the magnetic field applied to the recording layer 3 indicated with thick arrows in FIG. 22 is roughly uniformly distributed in the direction of saturation as with the comparative example in the vicinity of the first straight line 63 (write center line AW). However, the magnetic field applied to the recording layer 3 indicated with thick arrows in FIG. 22 shows an uneven distribution such as an orientation in the direction inclined with respect to the direction of the hard axis 92 as getting away from the first straight line 63 (write center line AW). This is due to the following fact: the direction of magnetization in a region not overlapping the write line WT in plan view (periphery region PR) does not receive the effects of the magnetic field due to the reduced write line current IWT; and roughly the same magnetization direction as that before flowing of the write line current IWT is kept. Specifically, referring to FIG. 21, for example, when the write line with the covering layer HR is used, each magnitude of the magnetic fields of the write line current IWT at the left periphery LP and the right periphery RP of the recording layer 3 is about ½ the magnitude of the magnetic field of the write line current IWT at the center line AW.

In other words, in the present embodiment, the magnetic field applied to the recording layer 3 by the write line current IWT ceases to be saturated particularly in a region away from the first straight line 63 (write center line AW). In this case, even when the write line current IWT is set at 0, the information originally possessed by the magnetic storage element ME is kept. Namely, even when the magnetic storage element ME using the recording layer 3 of the present embodiment is put in a semi-selected state by the write line WT, erroneous data reversal is inhibited.

Referring to FIG. 21 again, the ratio of the magnitude of the magnetic field in the direction of the hard axis at the endpoints LP and RP to that of the magnetic field in the direction of hard axis on the write center line AW is smaller for the write line with the covering layer HR than the write line without the covering layer HR. This is because the provision of the covering layer HR enhances the concentrating effect of the magnetic flux to the recording layer 3. Accordingly, the provision of the covering layer HR more enhances the effect of inhibiting the erroneous reversal in the recording layer 3 in the present embodiment.

Although not herein shown, the magnetic field generated by the bit line current IBL also provides the same distribution as the graph of FIG. 21. In other words, in the vicinity of the second straight line 64 (bit center line BW), the magnetic field generated by the bit line current IBL becomes maximum, and the magnetic field decreases in such a manner as to depict the same graph as that of FIG. 21 as getting away from the second straight line 64 (bit center line BW) in the direction of the top periphery TP (TP') or the bottom periphery BP (BP') (particularly, in a region not overlapping the bit line BL). Accordingly, referring to FIG. 23, the magnetic field generated by the bit line current IBL decreases as getting away from the second straight line 64 (write center line AW) (particularly, in a region not overlapping the bit line BL in plan view) as indicated with thin arrows in FIG. 23. For this reason, even when the magnetic storage element ME is put in a semi-selected state by the bit line current IBL, the magnetization direction in the periphery regions PR including the top periphery TP and the bottom periphery BP is not saturated. Therefore, the magnetization in the periphery region PR is distributed so as to inhibit the magnetization reversal (unevenly such as in an inclined manner with respect to the direction of the easy axis 91). This inhibits the magnetization reversal in only the magnetic field in one direction due to the bit line current IBL. Namely, in the present embodiment, even when the semi-selected state is caused by the bit line current IBL as with the case of the semi-selected state due to the write line current IWT, the original data of the recording layer 3 is kept.

Further, the bit line BL can also be inhibited in increase in bit line current IBL necessary for the write operation as with the write line WT by being covered with the covering layer HR.

Incidentally, the magnitude of the magnetic field generated by the bit line current IBL decreases as getting away from the second straight line 64 (bit center line BW). Therefore, as the top periphery TP and the bottom periphery BP of the recording layer 3 get away from the bit center line BW, the effect of inhibiting the erroneous reversal in the recording layer 3 due to the semi-selected state of the bit line current IBL increases. Namely, the top periphery TP and the bottom periphery BP are preferably selected so that the length L of the line segment coupling the top periphery TP and the bottom periphery BP becomes maximum.

Secondly, a consideration will be given to the case where the magnetic storage element ME is selected in the write operation. As described above, the magnetic field generated by the write line current IWT becomes maximum in the vicinity of the first straight line 63 (write center line AW) in plan view. The magnetic field generated by the bit line current IBL becomes maximum in the vicinity of the second straight line 64 (bit center line BW) in plan view. Then, each magnetic field sharply decreases in a region not overlapping the write line WT or the bit line BL in plan view.

Figure 24:
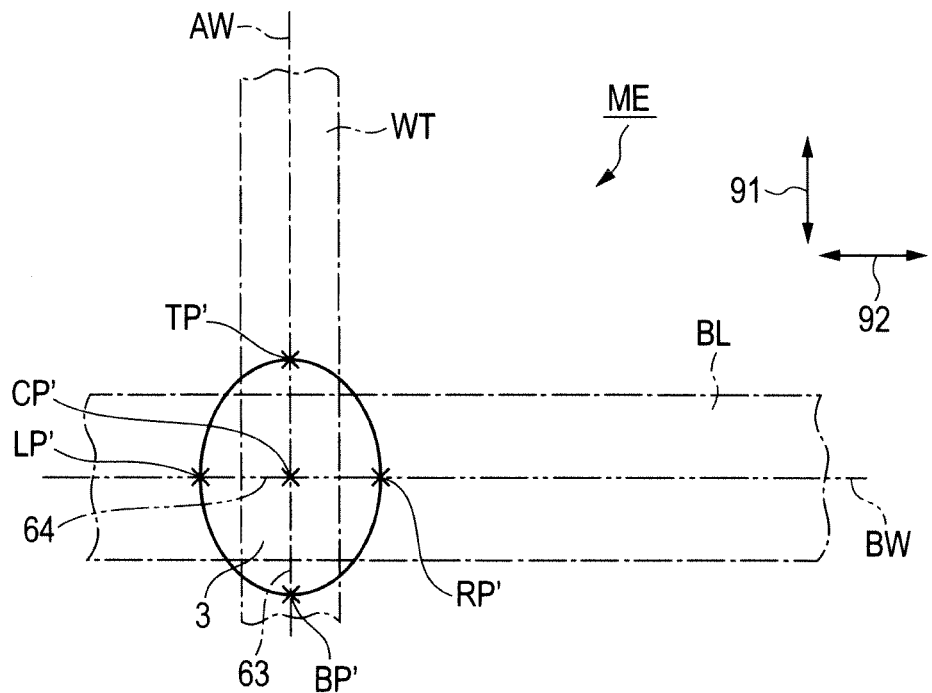
FIG. 24 is a schematic plan view showing the positional relationship between a recording layer and wiring of a magnetic storage element in a second comparative example of the first embodiment of the present invention.

Referring to FIG. 24, a second comparative example of the present embodiment basically has the same configuration as that of the first comparative example of FIG. 19. However, in the recording layer 3 of FIG. 24, the top periphery TP', the bottom periphery BP', the left periphery LP', and the right periphery RP', and the vicinity thereof overlap only any one of the write line WT or the bit line BL in plan view. Further, the recording layer 3 of FIG. 24 has a region not overlapping any of the write line WT and the bit line BL in plan view in some parts thereof (diagonal four corners in plan view).

For the recording layer 3 of FIG. 24, in a region not overlapping any of the bit line BL and the write line WT in plan view in the recording layer 3, the magnetic field from any wire decreases. For this reason, in the region, the magnetic fields applied by the write line current IWT and the bit line current IBL decrease. As compared with the recording layer 3 of the present embodiment shown in FIG. 10, the bit line current IBL and the write line current IWT necessary for the write operation increase.

On the other hand, the recording layer 3 of the magnetic storage element ME of the present embodiment is disposed so as to overlap at least one of the write line WT and the bit line BL at the entire region thereof in plan view. This configuration is implemented by forming the recessed parts R1 in the outer edge of the recording layer 3 in plan view. Accordingly, it is possible to write information in the recording layer 3 in a selected state without increasing the bit line current IBL and the write line current IWT. For this reason, it is possible to inhibit the failure and the increase in power consumption of the magnetic storage device MD.

In summary, in accordance with the recording layer 3 of the present embodiment, some region (including the top periphery TP, the left periphery LP, and the like) overlaps only any one of the write line WT and the bit line BL in plan view. As a result, it is possible to inhibit the erroneous reversal during the semi-selected state. Entire region overlaps at least any one of the write line WT and the bit line BL in plan view. As a result, it is possible to perform the write operation with reliability without increasing the power consumption (write current) in the selected state.

The magnetic storage element ME of the present embodiment eliminates the necessity of increasing the bit line current IBL and the write line current IWT than usual for writing information to a specific recording layer 3 particularly when the recording layers 3 in the matrix of a MRAM (magnetic storage device MD) vary in characteristics from one another. This enables the stable write operation. Further, the magnetic storage element ME of the present embodiment can inhibit the erroneous reversal of magnetization due to the saturation in one direction of the magnetization in the recording layer 3 put in the semi-selected state. For this reason, from the practical viewpoint, it is more preferable that the reversal of data due to the variations in the recording layers 3 of the magnetic storage elements ME arranged in a matrix can be inhibited.

Incidentally, the recording layer 3 of the present embodiment has the four projecting parts P1 and recessed parts R1 in plan view. The formation of the projecting parts P1 enables easy formation of the configuration in which the recording layer 3 overlaps only any one of the write line WT and the bit line BL at some region thereof (including the top periphery TP, the left periphery LP, and the like). The formation of the recessed parts R1 enables the easy formation of the configuration in which the recording layer 3 overlaps at least any one of the write line WT and the bit line BL at the entire region thereof in plan view.

In the magnetic storage element ME of the present embodiment, the left periphery LP and the right periphery RP (a pair of second endpoints) of the recording layer 3 are disposed on the bit center line BW (on the center line of the second conductive layer). In other words, in the present embodiment, the left periphery LP and the right periphery RP which are points of intersection between the second line segment perpendicularly dividing the first line segment of the recording layer 3 into two equal lengths and the outer edge of the recording layer 3 are disposed in such a manner as to overlap the bit center line BW. As a result, the recording layer 3 is disposed so as to be symmetrical with respect to the bit center line BW.

The bit line current IBL, for example, may flow from the left side to the right side of FIG. 10, or may flow from the right side to the left side of FIG. 10. The direction (upward direction or downward direction of FIG. 10) in which the selected recording layer 3 is magnetized along the easy axis 91 (crossing the bit line BL) is determined according to the direction of flow of the bit line current IBL. As in the present embodiment, the recording layer 3 is disposed so as to be symmetrical with respect to the bit center line BW. As a result, the magnitude or the distribution of the magnetic field applied to the recording layer 3 due to the bit line current IBL are the same (except that the directions are 180° opposite to each other) irrespective of the direction of flow of the bit line current IBL. Therefore, also when the data of the recording layer 3 is rewritten into any of the binary numbers, the absolute values of the bit line current IBL can be made equal. As a result, it is possible to more stabilize the write operation of the magnetic storage element ME.

In the present embodiment, the outer edge of the recording layer 3 in plan view is formed of a smooth curve. With this configuration, the recording layer 3 can be formed with ease even when miniaturized. Further, the rotation of magnetization becomes smooth, which facilitates control of the magnetization distribution in the recording layer 3.

Then, referring to FIG. 25, a description will be given to a magnetic storage element in accordance with a second example of the present embodiment.

Figure 25:
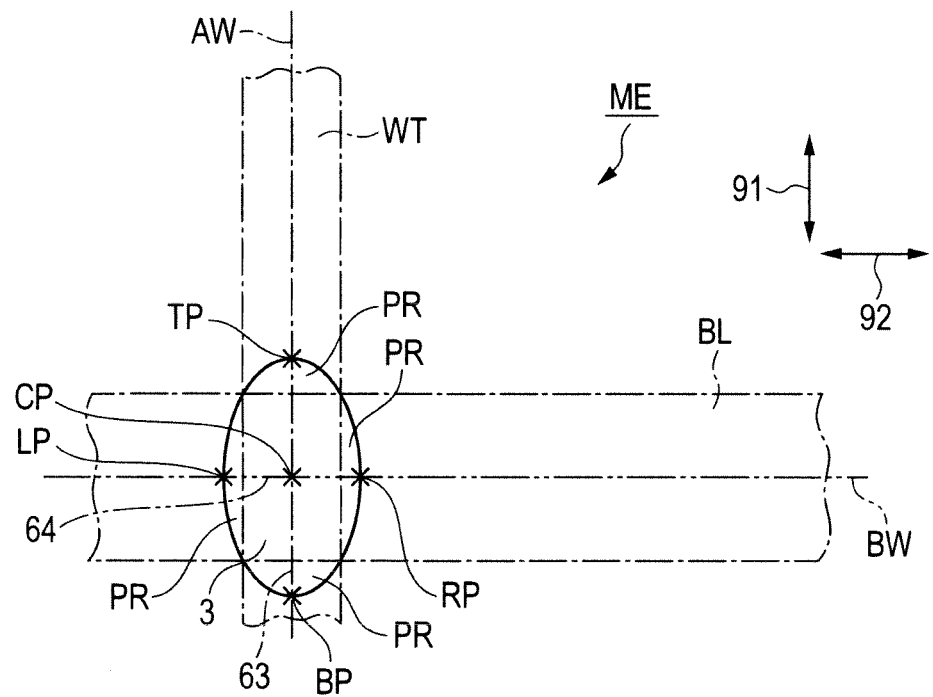
FIG. 25 is a schematic plan view showing the positional relationship between a recording layer and wiring of a magnetic storage element in a second example of the first embodiment of the present invention.

Referring to FIG. 25, the second example of the present embodiment basically has the same configuration as that of the first example of the present embodiment shown in FIG. 10. However, the recording layer 3 of FIG. 25 has the same ellipse shape as, for example, that of the comparative example of FIG. 24. Namely, the curve forming the outer edge of the recording layer 3 does not have the projecting part P1 and the recessed part R1 having points of inflection (see FIG. 9).

The second example of the present embodiment of FIG. 25 is equal in configuration to the first example of the present embodiment shown in FIG. 10 except for those described above. Therefore, the same elements are given the same reference numerals and signs, and a description thereon will not be repeated.

The recording layer 3 of FIG. 25 also overlaps at least one of the write line WT and the bit line BL at the entire region thereof in plan view as with the recording layer 3 of FIG. 10. The periphery regions PR including the top periphery TP, the left periphery LP, and the like overlap only any one of the write line WT and the bit line BL in plan view. By having such a configuration, the magnetic storage element ME of FIG. 25 also exerts the same effects as with the magnetic storage element ME in accordance with the first example of the present embodiment shown in FIG. 10.

Then, referring to FIG. 26, a description will be given to a magnetic storage element in accordance with a third example of the present embodiment.

Figure 26:
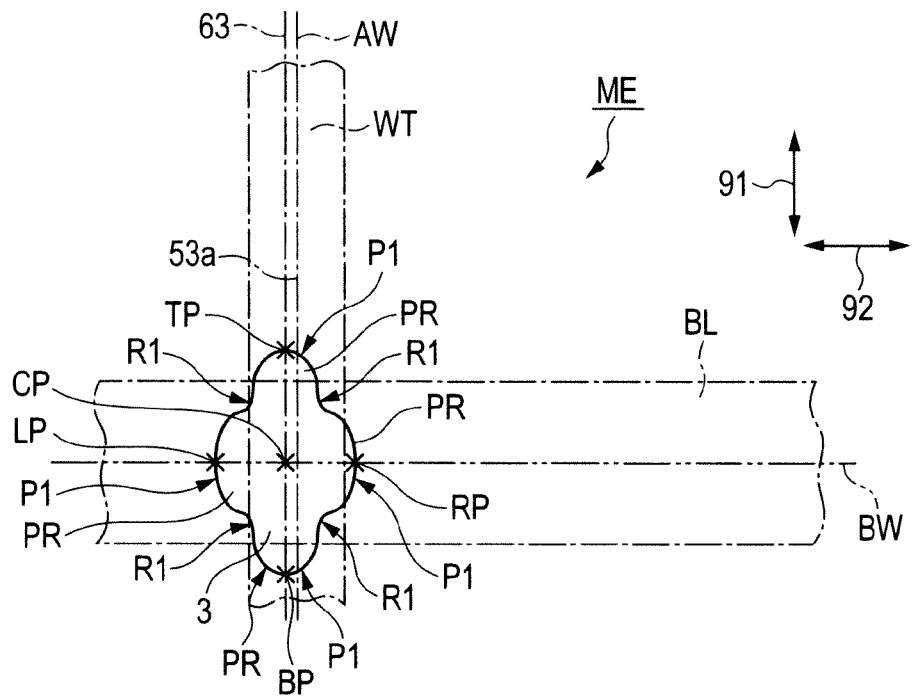
FIG. 26 is a schematic plan view showing the positional relationship between a recording layer and wiring of a magnetic storage element in a third example of the first embodiment of the present invention.

Referring to FIG. 26, the third example of the present embodiment basically has the same configuration as that of the first example of the present embodiment shown in FIG. 10. However, the recording layer 3 of FIG. 26 is disposed at a position to which the recording layer 3 of FIG. 10 is translated in the direction in which the recording layer 3 is along the hard axis 92 (the left-hand side of the figure). Namely, in FIG. 10, the first straight line 63 (first line segment) and the write center line AW overlap each other. In contrast, in FIG. 26, the first straight line 63 (first line segment) and the write center line AW do not overlap each other. Therefore, in FIG. 26, the recording layer 3 is not disposed at a position symmetrical with respect to the write center line AW.

The third example of the present embodiment of FIG. 26 is equal in configuration to the first example of the present embodiment shown in FIG. 10 except for those described above. Therefore, the same elements are given the same reference numerals and signs, and a description thereon will not be repeated. Namely, the recording layer 3 of FIG. 26 also overlaps at least one of the write line WT and the bit line BL at the entire region thereof in plan view as with the recording layer 3 of FIG. 10. The periphery regions PR including the top periphery TP, the left periphery LP, and the like overlap only any one of the write line WT and the bit line BL in plan view. Further, the recording layer 3 of FIG. 26 has the same planar shape as that of the recording layer 3 of FIG. 10, and is symmetrical with respect to the first straight line 63. By having such a configuration, the magnetic storage element ME of FIG. 26 also exerts the same effects as with the magnetic storage element ME in accordance with the first example of the present embodiment shown in FIG. 10.

Second Embodiment

The present embodiment is different from the first embodiment in shape in plan view of the recording layer 3. Below, the magnetic storage element ME in the present embodiment will be described by reference to FIGS. 27 to 34.

Figure 27:
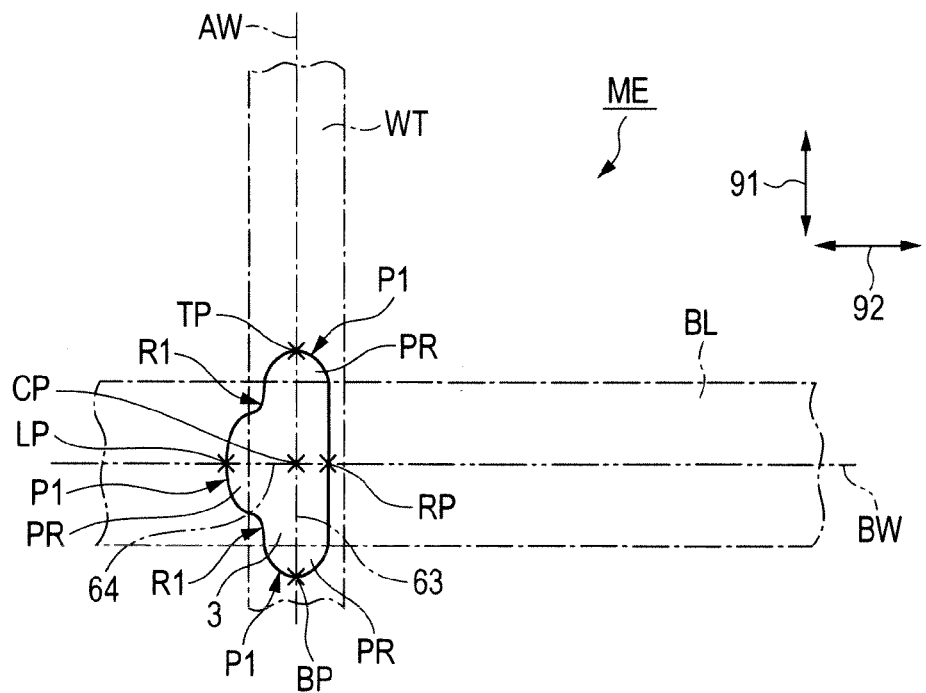
FIG. 27 is a schematic plan view showing the positional relationship between a recording layer and wiring of a magnetic storage element in a first example of a second embodiment of the present invention.

Referring to FIG. 27, in the magnetic storage element ME in accordance with (a first example of) the present embodiment, the recording layer 3 has a shape asymmetrical with respect to the first straight line 63, and symmetrical with respect to the second straight line 64. As a result, the recording layer 3 is disposed so as to be asymmetrical with respect to the write center line AW, and to be symmetrical with respect to the bit center line BW.

Specifically, the recording layer 3 of FIG. 27 has three projecting parts P1 so as to include the top periphery TP, the bottom periphery BP, and the left periphery LP. The recording layer 3 has two recessed parts R1 as with the recording layer 3 of the first embodiment, on the left-hand side in plan view. Namely, in the recording layer 3 of FIG. 27, in the region including the right periphery RP, the projecting part P1 and the periphery region PR are not formed, and in the vicinity of the right periphery RP, the outer edge of the recording layer 3 extends linearly so as to be along the write center line AW.

Thus, in (the first example of) the present embodiment, the recording layer 3 has at least three projecting parts P1 and two recessed parts R1. At least three of the top periphery TP, the bottom periphery BP, and the like are included in the projecting parts P1.

The recording layer 3 of FIG. 27 is disposed in such a manner as to overlap at least one of the write line WT and the bit line BL at the entire region thereof in plan view. The recording layer 3 overlaps only the bit line BL at the periphery region PR including the left periphery LP and the projecting part P1, and does not overlap the write line WT in plan view. However, the right periphery RP overlaps both of the bit line BL and the write line WT in plan view.

In the recording layer 3 of FIG. 27, as with the first embodiment, the second line segment passes through the central point C, and perpendicularly divide the first line segment (line segment coupling the top periphery TP and the bottom periphery BP) into two equal lengths. However, in the recording layer 3 of FIG. 27, the first line segment does not divide the second line segment into two equal lengths. Namely, the distance between the left periphery LP and the central point CP is longer than the distance between the right periphery RP and the central point CP.

The first example of the present embodiment of FIG. 27 is equal in configuration to the first example of the present embodiment shown in FIG. 10 except for those described above. Therefore, the same elements are given the same reference numerals and signs, and a description thereon will not be repeated.

Then, the advantageous effects of the present embodiment will be described. The present embodiment has, in addition to the advantageous effects of the first embodiment, the following advantageous effects.

Also in the present embodiment, as with the first embodiment, the recording layer 3 preferably has a shape symmetrical with respect to the bit center line BW, and is disposed so as to be symmetrical with respect to the bit center line BW. With this configuration, as with the first embodiment, irrespective of the direction of flow of the bit line current IBL determining which binary number the data of the recording layer 3 is rewritten into, the absolute values of the bit line current IBL can be made equal. As a result, it is possible to more stabilize the write operation of the magnetic storage element ME.

On the other hand the magnetic field due to the write line current IWT does not directly write the direction of magnetization in the recording layer 3 as data as with the magnetic field due to the bit line current IBL. The write line current IWT has a role of being flowed simultaneously with the bit line current IBL, and thereby selecting the magnetic storage element ME to which information is written. The write line current IWT also applies a magnetic field in the direction along the hard axis 92 to the recording layer 3 in order to allow the recording layer 3 of the selected magnetic storage element ME to be reversed in direction of magnetization with more ease in conjunction with the bit line current IBL.

Therefore, it is essential only that whether the write line current IWT flows or not can be controlled, and it is essential only that the flow is unidirectional. For this reason, it does not matter particularly in write operation even if the recording layer 3 is asymmetrical with respect to the write center line AW.

Further, when the recording layer 3 is asymmetrical with respect to the write center line AW, it becomes more difficult to reverse the magnetization in the recording layer 3 using only the magnetic field in the direction along the easy axis 91 as compared with the case where the recording layer 3 is symmetrical with respect to the center line AW. Namely, only by application of the magnetic field in the direction along the hard axis 92 in addition to the magnetic field in the direction along the easy axis 91, it becomes possible to reverse the direction of magnetization in the recording layer 3. Therefore, the present embodiment enhances the effect of inhibiting the erroneous reversal of the magnetization direction in the case where the recording layer 3 is put in a semi-selected state by being applied with only, for example, the magnetic field of the bit line current IBL.

In the present embodiment, the shape having at least three (including the first and second peripheries) projecting parts and two recessed parts can largely provide the foregoing effects.

Figure 28:
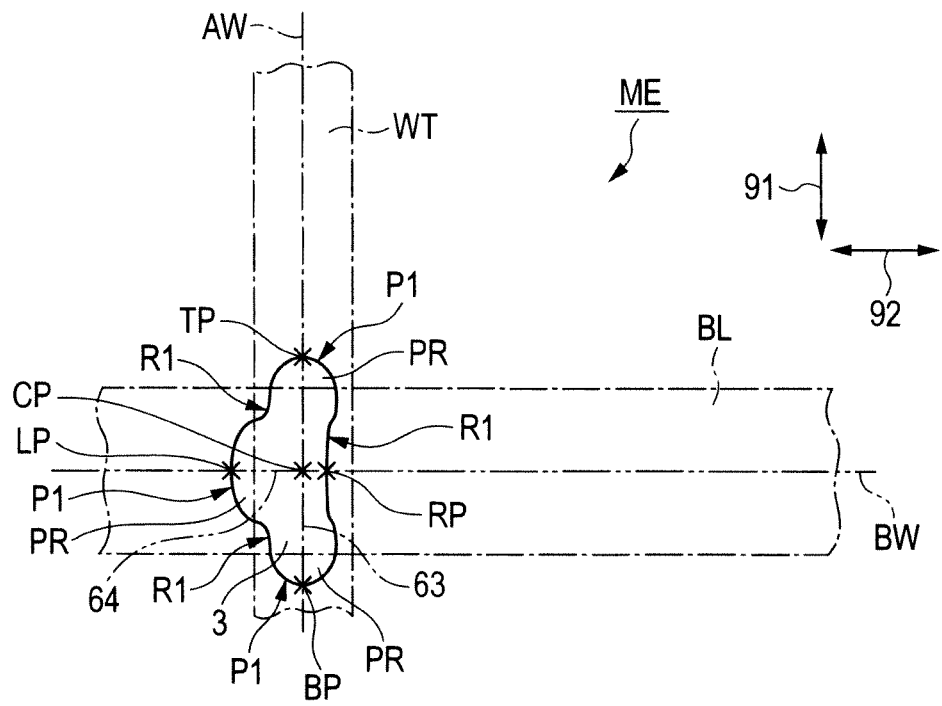
FIG. 28 is a schematic plan view showing the positional relationship between a recording layer and wiring of a magnetic storage element in a second example of the second embodiment of the present invention.

Referring to FIG. 28, a magnetic storage element ME in accordance with a second example of the present embodiment has basically the same configuration as that of the magnetic storage element ME in accordance with the first example of the present embodiment shown in FIG. 27. However, in FIG. 28, the outer edge of the recording layer 3 including the right periphery RP has a shape contracted to the left-hand side of the figure than the corresponding site of the recording layer 3 of FIG. 27. Namely, the curve including the right periphery RP has a recessed shape, and has a total of three recessed parts R1.

The second example of the present embodiment of FIG. 28 is equal in configuration to the first example of the present embodiment shown in FIG. 27, except for those described above. Namely, the recording layer 3 of FIG. 28 is symmetrical with respect to the second straight line 64, and asymmetrical with respect to the first straight line 63. As a result, the recording layer 3 of FIG. 28 is symmetrical with respect to the bit center line BW, and asymmetrical with respect to the write center line AW. In the recording layer 3 which is asymmetrical with respect to the first straight line 63 (first line segment), the distance between the left periphery LP and the central point CP is longer than the distance between the right periphery RP and the central point CP.

Figure 29:
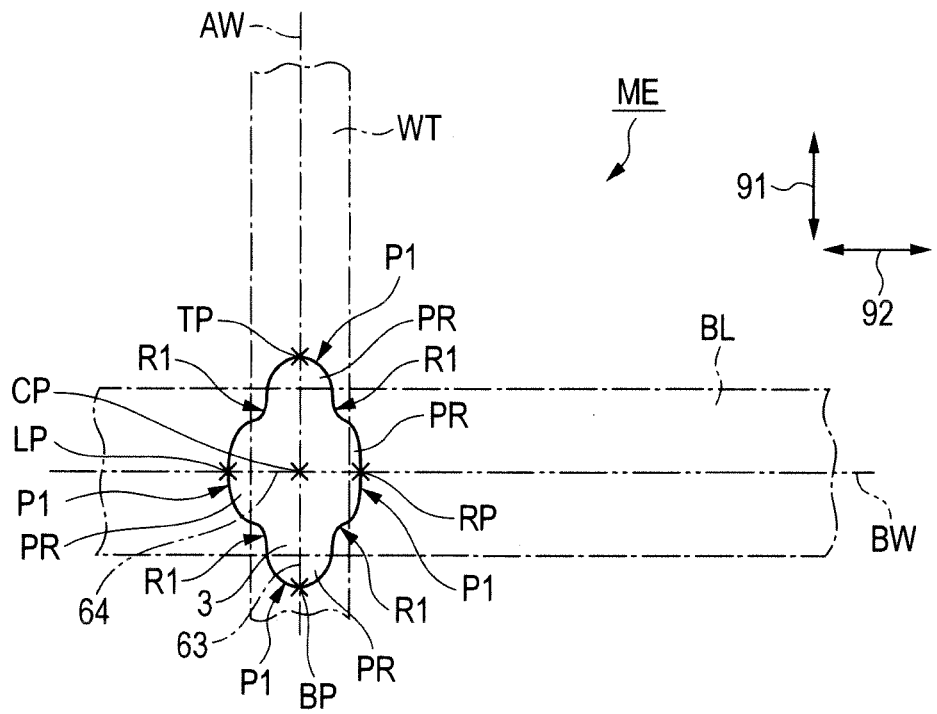
FIG. 29 is a schematic plan view showing the positional relationship between a recording layer and wiring of a magnetic storage element in a third example of the second embodiment of the present invention.

Referring to FIG. 29, a magnetic storage element ME in accordance with a third example of the present embodiment has basically the same configuration as that of the magnetic storage element ME in accordance with the first example of the present embodiment shown in FIG. 10. However, in FIG. 29, the outer edge of the recording layer 3 including the right periphery RP (region including the projecting part P1) has a shape contracted to the left-hand side of the figure than the corresponding site of the recording layer 3 of FIG. 10. Therefore, the distance between the left periphery LP and the central point CP is longer than the distance between the right periphery RP and the central point CP. Accordingly, the recording layer 3 is asymmetrical with respect to the first straight line 63 (first line segment) and the write center line AW. The third example of the present embodiment of FIG. 29 is equal in configuration to the first example of the present embodiment shown in FIG. 27 except for those described above.

From a different viewpoint, in the present embodiment, all of the first to third examples shown in FIGS. 27 to 29 have shapes each contracted toward the left-hand side in the region including the right periphery RP relative to the recording layer 3 of the first example of the first embodiment shown in FIG. 10, and increase in degree of the contraction gradually in the order of FIGS. 29, 27, and 28.

Figure 30:
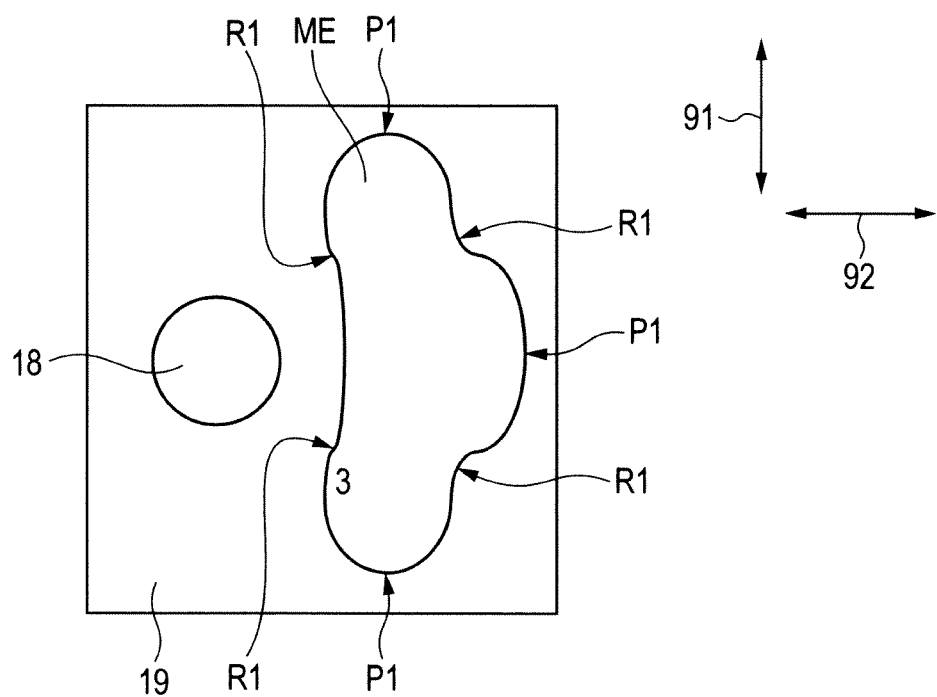
FIG. 30 is a schematic plan view of the relationship between the recording layer and the coupling member of the magnetic storage element of FIG. 28 as seen from above.

When the recording layer 3 of FIG. 28, which is the largest in degree of the contraction of the recording layer 3 of FIGS. 27 to 29, the conductive layer 19 over which the recording layer 3 is formed, and the coupling member 18 over which the conductive layer 19 is formed are, when viewed in plan from above, shown as the mode roughly shown in FIG. 30. However, herein, the fixed layer 1, the tunneling insulation layer 2, and the recording layer 3 are all assumed to have the same shape and the same dimensions in plan view.

Then, referring to FIGS. 30 and 31, a description will be given to other advantageous effects common to the first to third examples of the present embodiment.

As in FIG. 30, the recording layer 3 has a shape contracted relative to the recording layer 3 of FIG. 10, with respect to the direction opposed to the coupling member 18 (e.g., the direction of presence of the right periphery RP). As a result, the occupying area in plan view of the recording layer 3 is reduced. For this reason, it is possible to increase the integration density of the magnetic storage elements ME.

Figure 31:
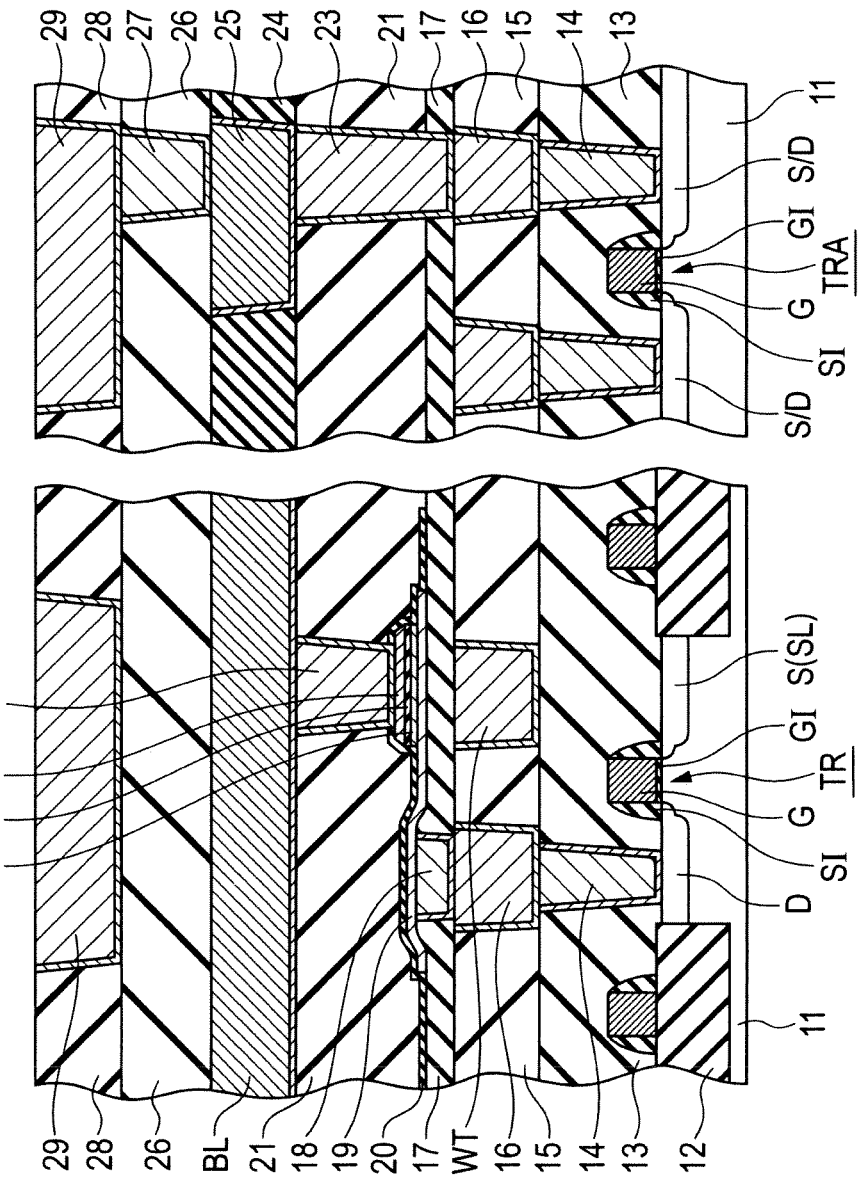
FIG. 31 is a schematic cross-sectional view showing a mode in which a conductive layer over the coupling member swells upwardly.

Referring to FIG. 31, generally, the uppermost surface of the coupling member 18 projects upwardly with respect to the uppermost surface of the interlayer insulation film 17. In addition, (although not shown,) the uppermost surface of the coupling member 18 becomes a recessed surface subjected to dishing. At this step, at the surface of the conductive layer 19 formed in such a manner as to cover the uppermost surfaces of the coupling member 18 and the interlayer insulation film 17, a step is formed. The formation of a step at the surface of the conductive layer 19 may affect the operation characteristics of the ferromagnetic tunneling junction element MM formed over the conductive layer 19, and the write operation of the recording layer 3.

Thus, as shown in FIG. 30, the recording layer 3 has a planar shape contracted with respect to the direction opposed to the coupling member 18. As a result, the recording layer 3 can avoid being affected by the step at the surface of the conductive layer 19. Namely, the ferromagnetic tunneling junction elements MM can be integrated without being affected by their corresponding steps.

Whereas, the recording layer 3 is asymmetrical with respect to the write center line AW in plan configuration. For this reason, under the influence of the magnetic anisotropy due to the plan configuration of the recording layer 3, the distribution of the magnetic field applied to the recording layer 3 due to the write line current IWT becomes asymmetrical with respect to the easy axis 91 as distinct from, for example, the mode shown in FIG. 20. Accordingly, with respect to the magnetic field applied to the recording layer 3 by the write line current IWT, on the side of one periphery, particularly, the left periphery LP of the recording layer 3, saturation of the magnetic field applied to the recording layer 3 due to the write line current IWT is inhibited. This is because the distance between the left periphery LP and the central point CP is longer than the distance between the right periphery RP and the central point CP.

Therefore, the shape in plan view of the recording layer 3 and the distribution of the magnetic field applied by the write line current IWT are both asymmetrical with respect to the write center line AW. For this reason, it is possible to inhibit the erroneous reversal in the recording layer 3 put in a semi-selected state due to the write line current IWT with more reliability.

Figure 32:
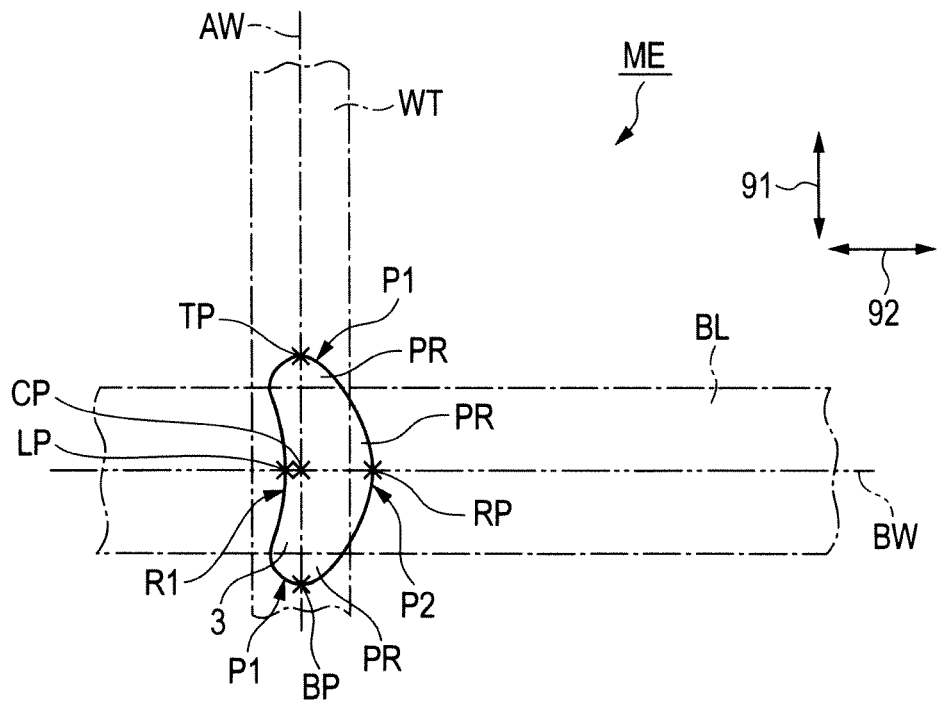
FIG. 32 is a schematic plan view showing the positional relationship between a recording layer and wiring of a magnetic storage element in a fourth example of the second embodiment of the present invention.

Further, as another modified example, for example, referring to FIG. 32, the recording layer 3 of the magnetic storage element ME in accordance with the present embodiment may have an arched shape having an outer edge of a combination of a projecting part P2 not having a inflection point, a projecting part P1 having at least one inflection point, and a recessed part R1. Alternatively, for example, referring to FIGS. 33 and 34, the magnetic recording element ME may have a recording layer 3 having one projecting part P2 in the direction of the right periphery RP, and other endpoints (the top periphery TP, the bottom periphery BP, and the left periphery LP) present on the outer edge extending (linearly) in the direction of extension of the write line WT or the bit line BL. Also when the magnetic storage elements ME are used, the same effects as those of the first embodiment or the second embodiment are exerted.

FIGS. 32 to 34 also show as follows: as with other embodiments, the easy axis 91 of the recording layer 3 and the write line WT extend in the top-to-down direction of the figure; and the hard axis 92 of the recording layer 3, and the bit line BL extend in the left-to-right direction of the figure. However, in actuality, when the recording layer has an asymmetrical and nonuniform shape as each recording layer of FIGS. 32 to 34, the directions of the easy axis 91 and the hard axis 92 of the recording layer 3 may be inclined with respect to the directions. In this case, for example, the write line WT may be disposed so as to be along the direction of extension (inclined with respect to each direction shown in FIGS. 32 to 34) of the recording layer 3, and the bit line BL may be disposed so as to cross (be roughly orthogonal to) the write line WT.

Alternatively, when the easy axis 91 and the hard axis 92 cross each other in such a manner as not to be roughly orthogonal to each other (e.g., to form an acute angle therebetween) according to the shape of the recording layer 3, the arrangement of the write line WT and the bit line BL may be adjusted according to the directions of the easy axis 91 and the hard axis 92, for example, so that the write line WT and the bit line BL cross each other in such a manner as not to be orthogonal to each other.

Basically, the write line WT preferably generates a magnetic field in the direction crossing the direction of extension of the easy axis 91 (in other words, the direction along the direction of extension of the hard axis 92). The bit line BL preferably generates a magnetic field extending in the direction crossing the direction of extension of the hard axis 92 (in other words, the direction along the direction of extension of the easy axis 91). For this reason, when the hard axis 92 crosses the easy axis 91 in such a manner as to form an acute angle therebetween, the bit line BL preferably crosses the easy axis 91 in such a manner as to form an acute angle therebetween. Further, the write line WT and the bit line BL may appropriately be curved differently from one region to another according to the disposition, the shape, the configuration, and the like of each magnetic storage element ME.

In the embodiments of the present invention described up to this point, the description was given by taking the memory cell in which one magnetic storage element ME is disposed in one memory cell as an example. However, in the embodiments of the present invention, two or more magnetic storage elements ME may be disposed in one memory cell, and further, the memory cells may be stacked one on another.

The present invention is in particular advantageously applicable to a magnetic storage element having a recording layer changing in magnetization direction, and a magnetic storage device having the magnetic storage element.

What is claimed is:

1. A magnetic storage element, comprising:
    a recording layer changeable in magnetization direction by an external magnetic field, the recording layer having an easy axis along a direction in which magnetization is easy, and a hard axis along a direction which crosses the easy axis and in which magnetization is hard;
    a first conductive layer for forming a magnetic field along a direction of extension of the hard axis in plan view; and
    a second conductive layer for forming a magnetic field along a direction of extension of the easy axis in plan view,
    wherein the recording layer is disposed in such a manner as to overlap at least one of the first or second conductive layer at the entire region thereof in plan view,
    wherein first endpoints which are a pair of endpoints of a first line segment along the easy axis, and maximum in dimension overlapping the recording layer in plan view do not overlap the second conductive layer in plan view, and
    wherein at least one of second endpoints which are a pair of endpoints of a second line segment passing through the middle point of the first line segment, orthogonal to the first line segment in plan view, and overlapping the recording layer in plan view does not overlap the first conductive layer in plan view.

2. The magnetic storage element according to claim 1, wherein a pair of the second endpoints are disposed on the center line of the second conductive layer.

3. The magnetic storage element according to claim 1, wherein the recording layer has at least three projecting parts and two recessed parts in plan view, and wherein at least three of the first and second endpoints are included in the projecting parts.

4. The magnetic storage element according to claim 1, wherein the recording layer has a shape asymmetrical with respect to the center line of the first conductive layer, and symmetrical with respect to the center line of the second conductive layer.

5. The magnetic storage element according to claim 1, wherein the side surface, and at least either of the top surface or the bottom surface of the first or second conductive layer in a cross section crossing in the direction of extension of the first or second conductive layer are covered with a thin film having a higher magnetic permeability than that of the first or second conductive layer.

6. The magnetic storage element according to claim 1, wherein the outer edge of the recording layer is formed of a smooth curve.

7. A magnetic storage device, comprising the magnetic storage element according to claim 1.

* * * * *